US012666587B2

(12) United States Patent

Wang et al.

(10) Patent No.: US 12,666,587 B2

(45) Date of Patent: Jun. 23, 2026

(54) MEMORY DEVICES WITH A BACKSIDE READ BIT LINE

(71) Applicant: Taiwan Semiconductor Manufacturing Company, Ltd., Hsin-Chu (TW)

(72) Inventors: Ping-Wei Wang, Hsin-Chu (TW); Feng-Ming Chang, Hsinchu County (TW); Jui-Lin Chen, Taipei City (TW); Yu-Bey Wu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 362 days.

(21) Appl. No.: 18/469,856

(22) Filed: Sep. 19, 2023

(65) Prior Publication Data

US 2025/0098137 A1    Mar. 20, 2025

(51) Int. Cl.
H10B 10/00         (2023.01)

(52) U.S. Cl.
CPC .................................. H10B 10/125 (2023.02)

(58) Field of Classification Search
None
See application file for complete search history.

(56)                References Cited

U.S. PATENT DOCUMENTS

| 9,672,903 | B2 | 6/2017 | Liaw | |
| 2013/0064009 | A1 | 3/2013 | Kitano | |
| 2022/0392904 | A1* | 12/2022 | Liaw | H01L 23/528 |
| 2024/0040763 | A1* | 2/2024 | Liaw | H10D 30/6735 |

FOREIGN PATENT DOCUMENTS

TW          201727641 A      8/2017

OTHER PUBLICATIONS

Wang et al., "Interconnect Structures for Integration of Memory Cells and Logic Cells," U.S. Appl. No. 18/446,576, filed Aug. 9, 2023, Assignee: Taiwan Semiconductor Manufacturing Company, Ltd., 38 pages of specification, 55 pages of drawings.

* cited by examiner

*Primary Examiner* — Tong-Ho Kim
(74) *Attorney, Agent, or Firm* — HAYNES AND BOONE, LLP

(57)          ABSTRACT

Semiconductor structures and methods are provided. An exemplary semiconductor structure according to the present disclosure includes a two-port static random access memory (SRAM) cell having a write port portion and a read port portion electrically coupled to the write port portion. The read port portion includes a transistor having a first source/drain feature and a second source/drain feature. The semiconductor structure also includes a first plurality of metal lines comprising a write bit line and a complementary write bit line, wherein the first plurality of metal lines are positioned at a first metal interconnect layer, wherein the first metal interconnect layer is disposed over the first source/drain feature. The semiconductor structure also includes a read bit line positioned at a second metal interconnect layer, where the second metal interconnect layer is disposed under the first source/drain feature.

20 Claims, 16 Drawing Sheets

MEMORY DEVICES WITH A BACKSIDE READ BIT LINE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, aggressive scaling down of IC dimensions has resulted in densely spaced source/drain features and gate structures, and densely spaced source/drain contacts and gate vias. In some IC circuits (e.g., memory devices), multilayer interconnect structure providing metal tracks (metal lines) for interconnecting power lines and signal lines in and between memory cells of the memory devices are formed over transistors of the memory cells. With ever-decreasing device sizes and densely spaced transistors, some metal tracks (e.g., landing pads for signal lines) are formed to have reduced dimensions, which may lead to increased parasitic resistance, increased parasitic capacitance, high process risk, and/or poor connection; some signal lines may be arranged in a metal line that is far away from the memory cell, which may degrade the speed of the memory devices. All those issues present performance, yield, and cost challenges. Therefore, while existing memory devices may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
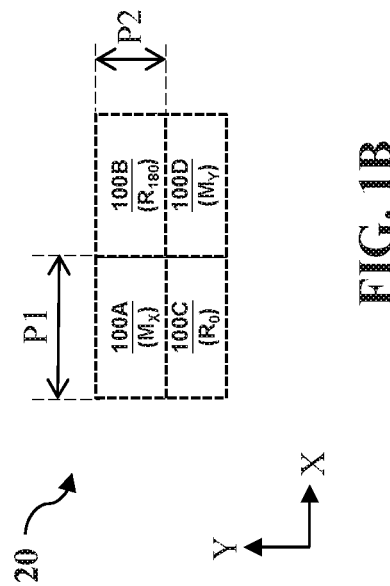
FIG. 1B is a diagrammatic plan view of an array of memory cells, such as static random-access memory (SRAM) cells, in portion or entirety, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow may be typically divided into three categories: front-end-of-line (FEOL) processes, middle-end-of-line (MEOL) processes, and back-end-of-line (BEOL) processes. FEOL processes generally encompasses processes related to fabricating IC devices, such as transistors. For example, FEOL processes may include forming isolation features, gate structures, and source/drain features. Source/drain feature(s) may refer to a source or a drain, individually or collectively dependent upon the context. Multi-gate devices, such as fin field-effect transistors (FinFETs) and multi-bridge-channel (MBC) transistors, have been introduced in an effort to improve gate control by increasing gate-channel coupling, reduce OFF-state current, and reduce short-channel effects (SCEs). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. MEOL processes generally encompasses processes related to fabricating contacts to conductive features of the IC devices, such as gate vias to the gate structures and/or source/drain contacts to the source/drain features. BEOL processes generally encompasses processes related to fabricating a multilayer interconnect structure that interconnects IC features fabricated by FEOL and MEOL process, thereby enabling operation of the IC devices. Features fabricated by FEOL processes may be referred to as FEOL features. Features fabricated by MEOL processes may be referred to as MEOL features. Features fabricated by BEOL processes may be referred to as BEOL features.

To perform satisfactory functions, static random-access memory (SRAM) cells are electrically coupled to signal lines and power lines. For example, a two-port SRAM cell formed of seven transistors (i.e., 7T SRAM cell) is electrically coupled to signal lines including a read-port bit line R_BL, a read-port word line R_WL, a write-port bit line W_BL, a write-port word line W_WL and power lines configured to provide predetermined voltages VDD and VSS (may be referred to as VDD line and VSS line, respectively). In some exiting technologies, all those signal lines and power lines and related landing pads are formed in metal lines that are disposed over a frontside of the SRAM cell(s). In the present disclosure, landing pads generally refer to metal lines in metal interconnect layers that provide intermediate, local interconnection for the SRAM cell, such as (1) an intermediate, local interconnection between a device-level feature (e.g., gate or source/drain) and a bit line, a bit line bar, a word line, a voltage line or (2) an intermediate, local interconnection between bit lines, word lines, or power lines. As described above, aggressive scaling down of IC dimensions has resulted in densely spaced transistors and thus densely spaced BEOL features with reduced dimensions, which may lead to increased parasitic resistance, increased parasitic capacitance, increased process risk, and/or reduced speed.

The present disclosure provides memory devices including a contact via and a read-port bit line formed under a backside of the SRAM cell instead of forming the read-port bit line over a frontside of the SRAM cell to relax process windows and limits on SRAM performance optimization. In an embodiment, the memory device includes a 7T SRAM cell having a write portion and a read portion, and a transistor of the read portion having a first source/drain feature coupled to write portion and a second source/drain feature electrically coupled to a read-port bit line. In a cross-sectional view, the read-port bit line is disposed under the second source/drain feature. Forming the read-port bit line under the second source/drain feature would release room that would be otherwise occupied by a frontside landing pad for a frontside read-port bit line, thus design flexibility of metal lines that are disposed over the SRAM cell may be increased, dimensions of the backside read-port bit line and frontside signal lines such as frontside write-port bit line may be increased for performance optimization.

Figure 1A:
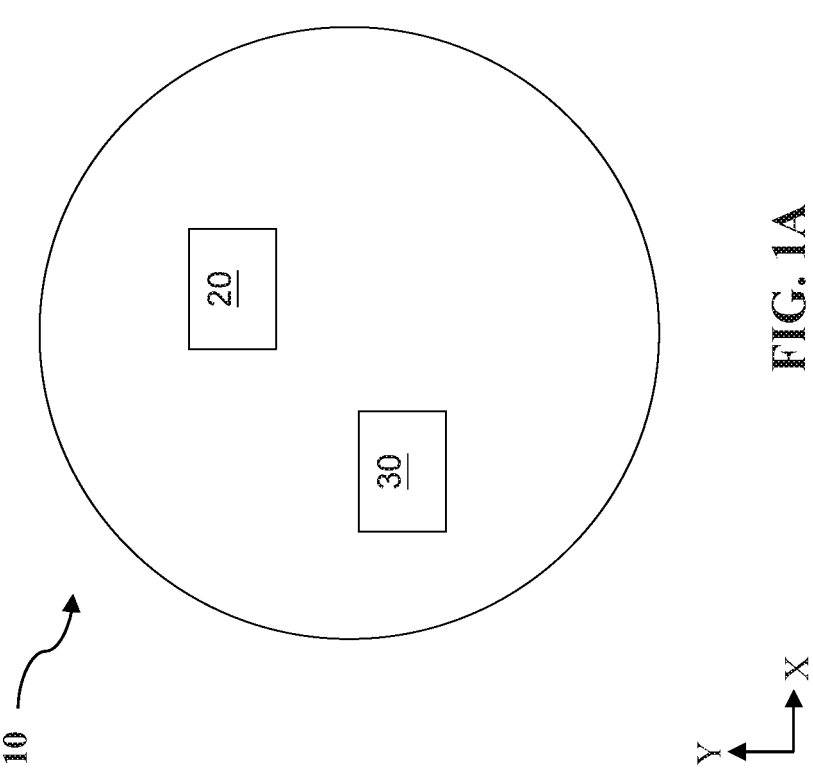
FIG. 1A is a diagrammatic plan view of an IC chip, in portion or entirety, according to various aspects of the present disclosure.
Figure 2:
FIG. 2 is a circuit diagram of a memory cell, such as an SRAM cell, that can be implemented in the IC chip of FIG. 1, according to various aspects of the present disclosure.
Figure 3:
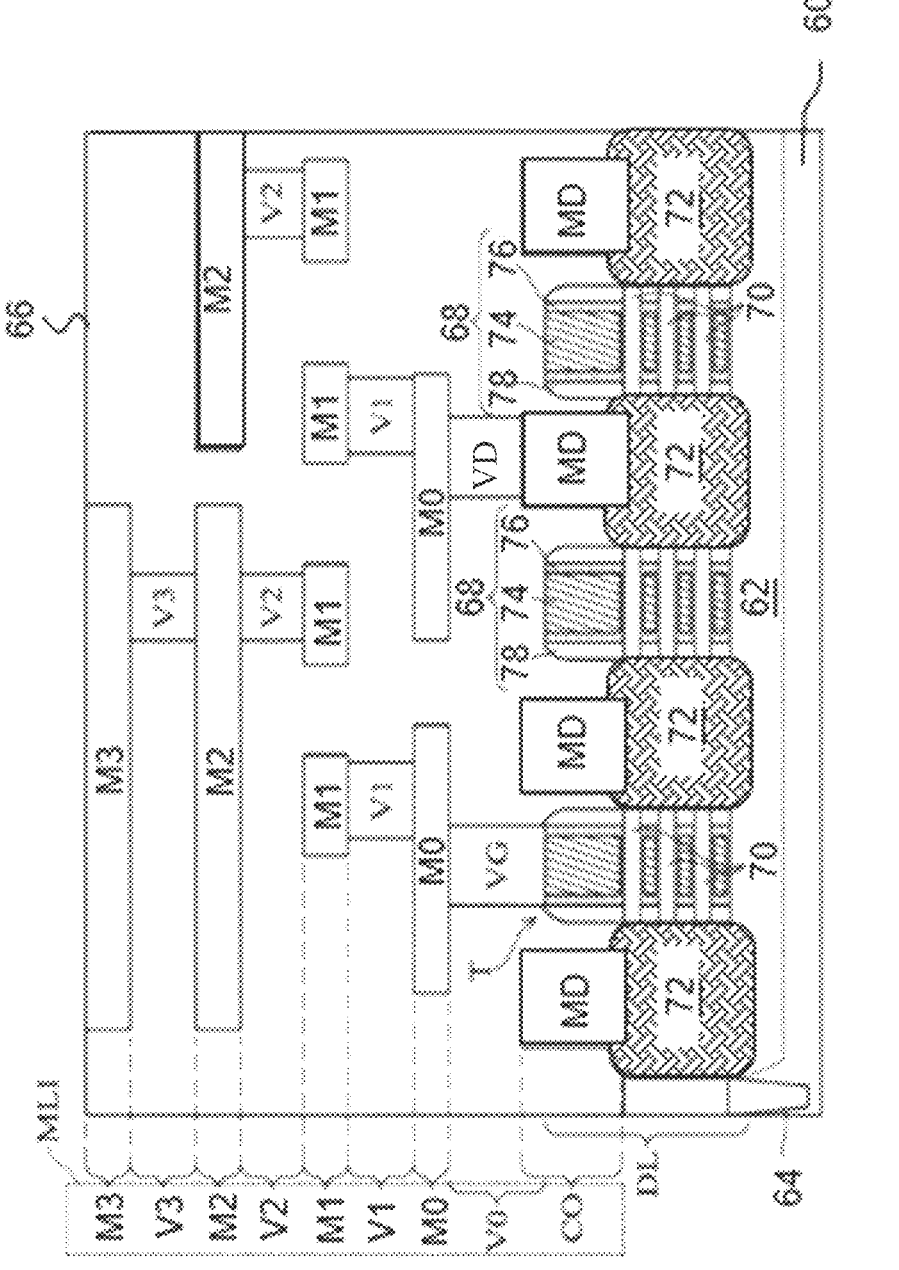
FIG. 3 illustrates a cross-sectional view of various layers of a memory device, in portion or entirety, according to various aspects of the present disclosure.
Figure 9:
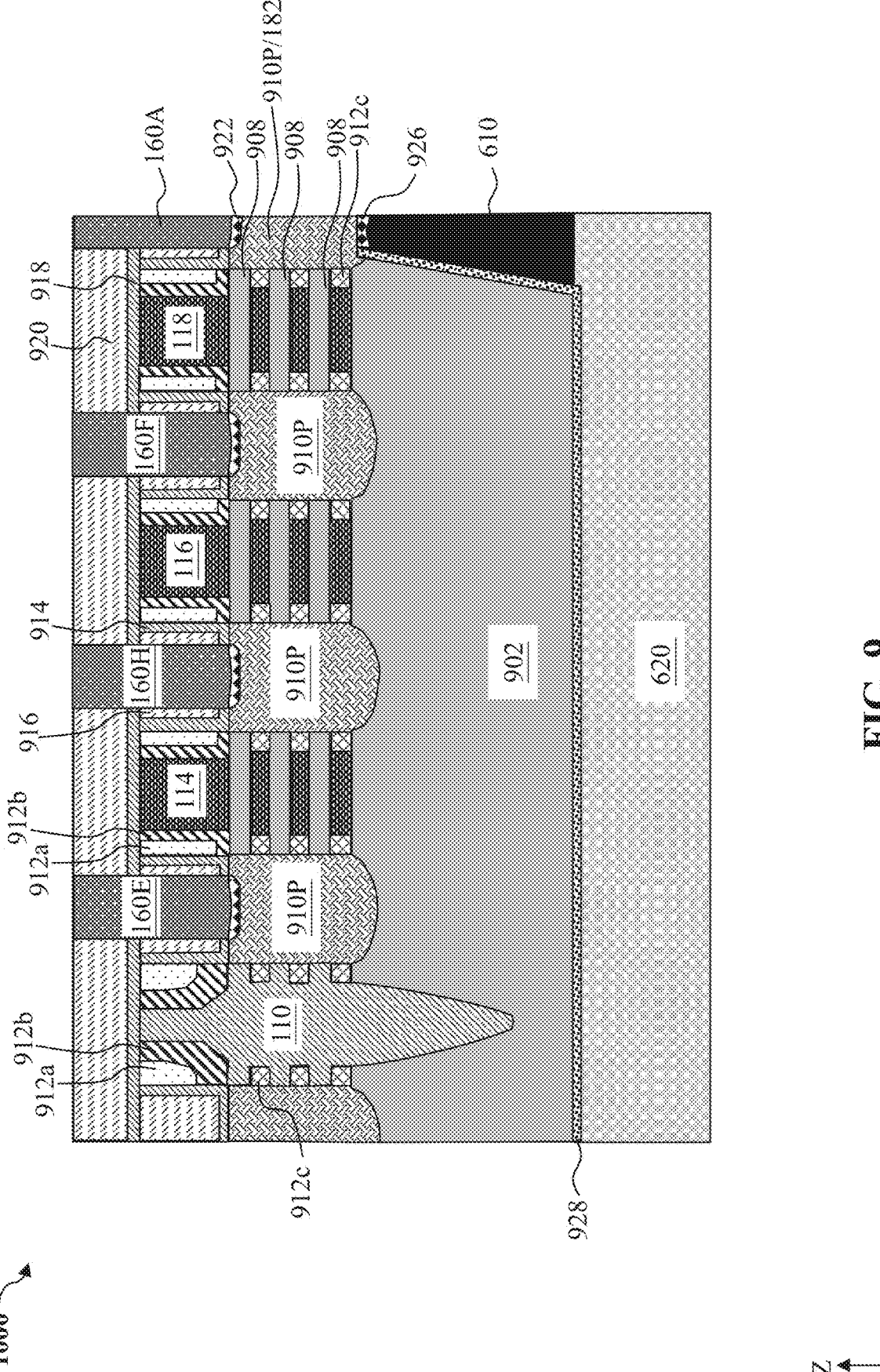
FIG. 9 illustrates a cross-sectional view of the memory device taken along line A-A' shown in FIGS. 4 and 6, in portion or entirety, according to various aspects of the present disclosure.
Figure 10:
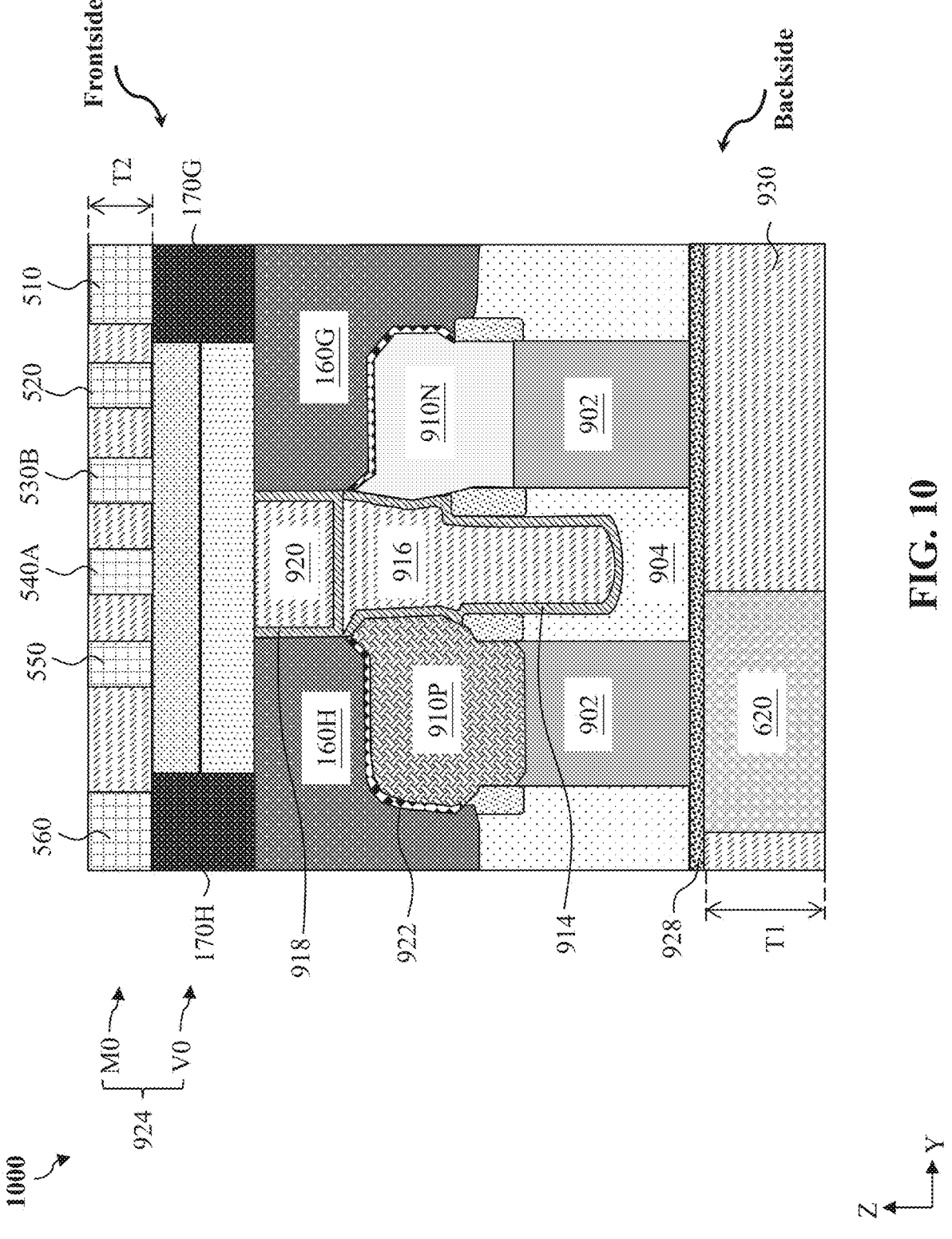
FIG. 10 illustrates a cross-sectional view of the memory device taken along line B-B' shown in FIGS. 4-6, in portion or entirety, according to various aspects of the present disclosure.
Figure 11:
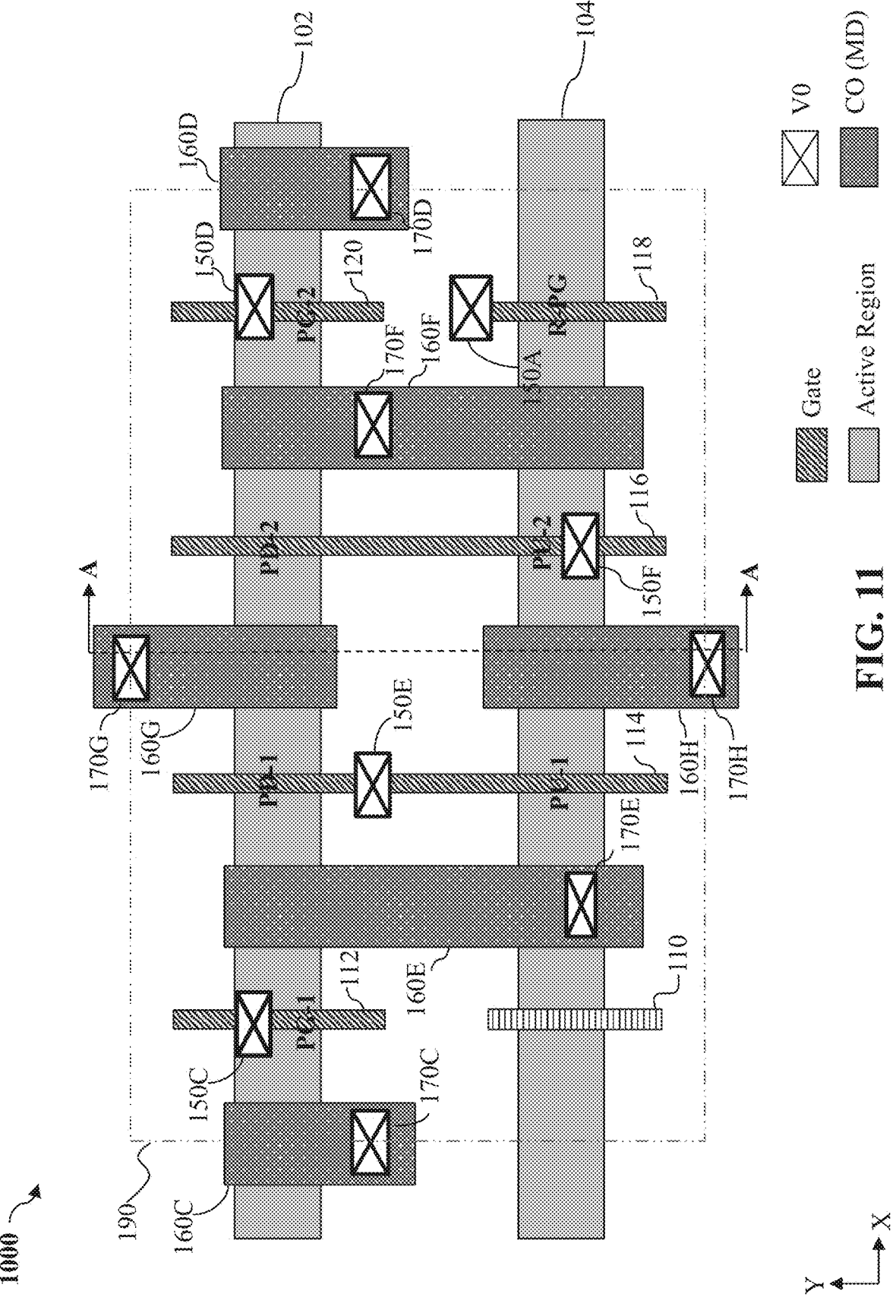
FIG. 11 illustrates an alternative layout of the memory device having the SRAM cell of FIG. 2, in portion or entirety, according to various aspects of the present disclosure.
Figure 12:
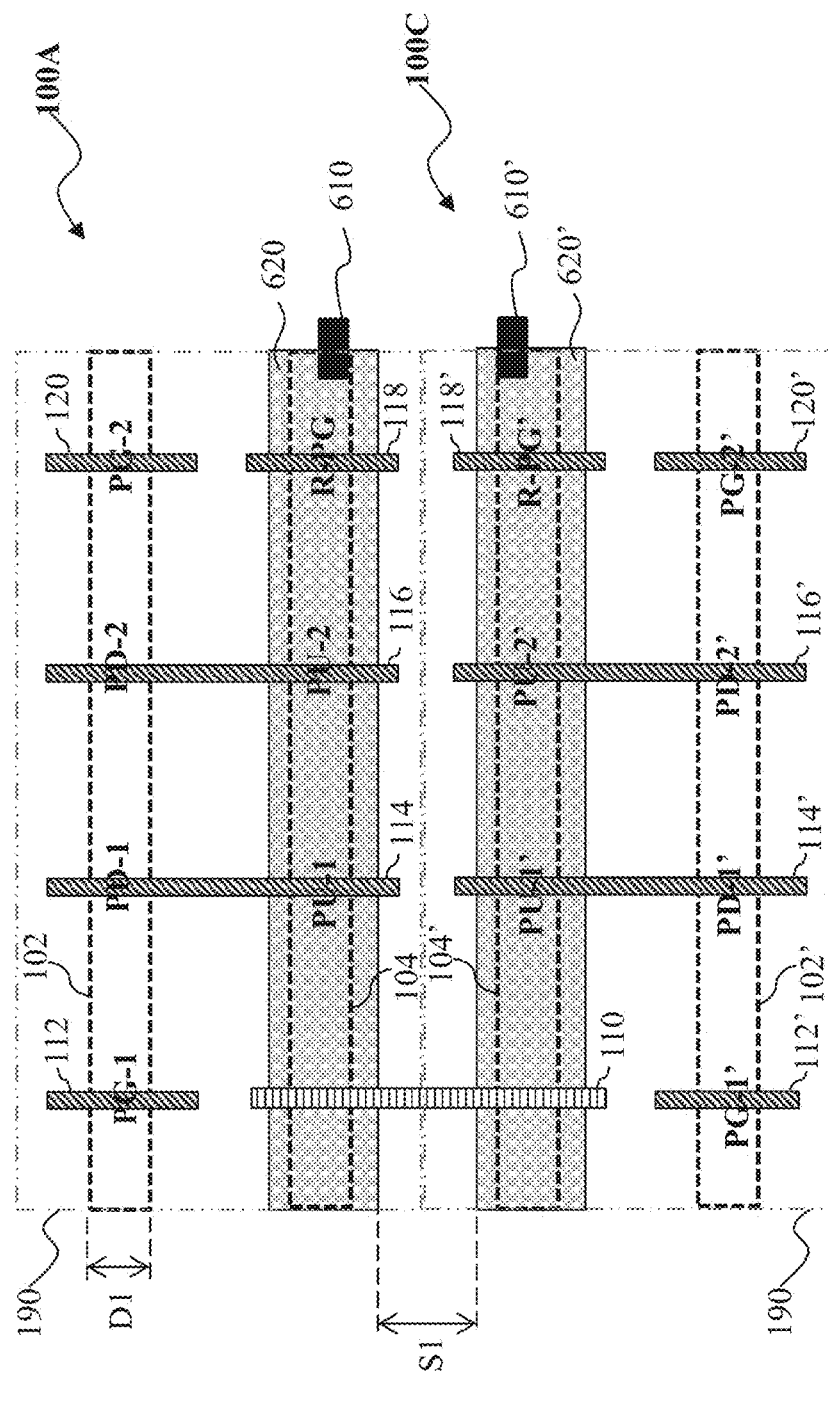
FIG. 12 illustrates a layout of various layers of another memory device, in portion or entirety, according to various aspects of the present disclosure.
Figure 13:
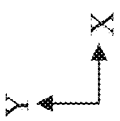
FIG. 13 illustrates a first alternative layout of various layers of the memory device in FIG. 12, in portion or entirety, according to various aspects of the present disclosure.
Figure 14:
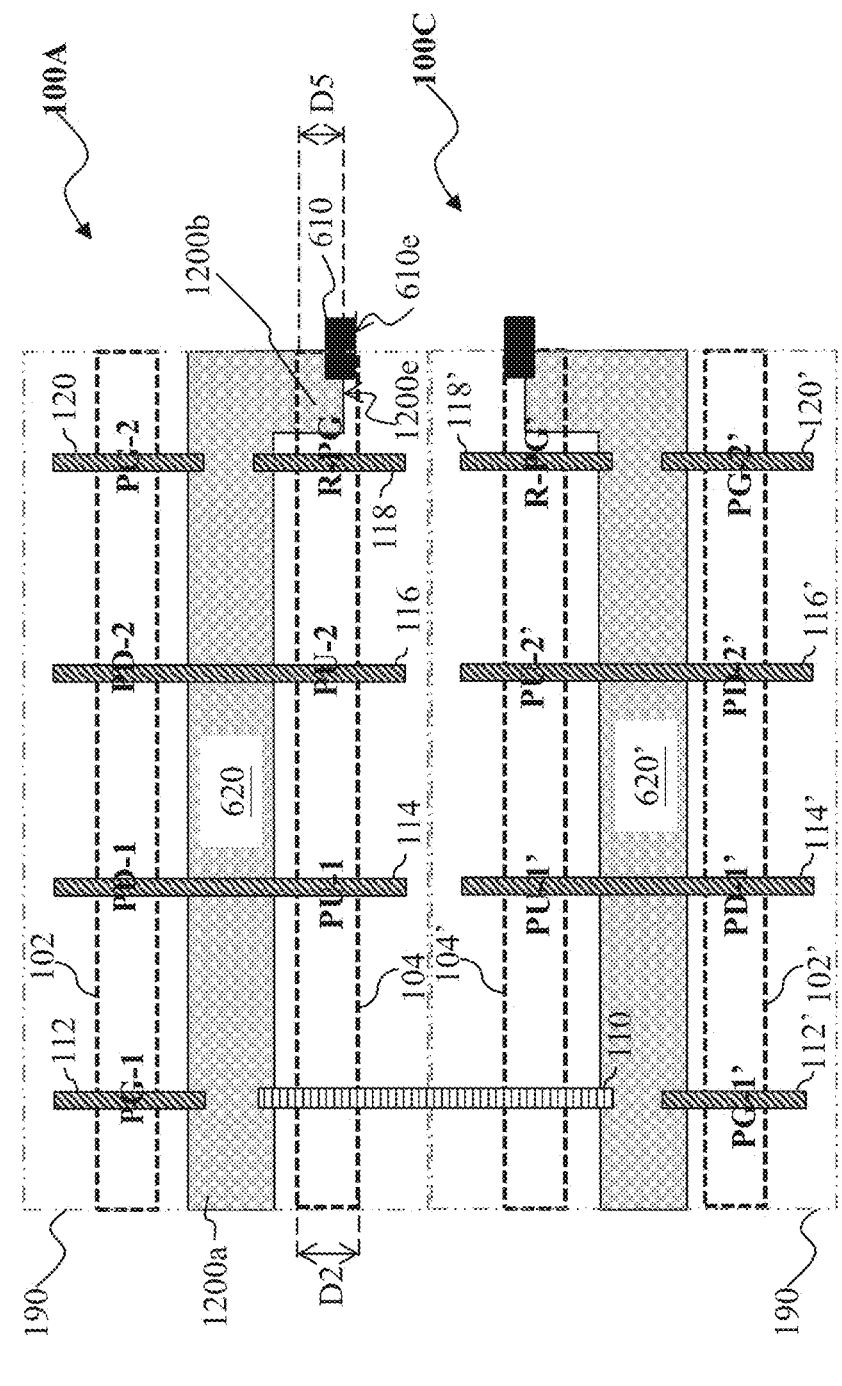
FIG. 14 illustrates a second alternative layout of various layers of the memory device in FIG. 12, in portion or entirety, according to various aspects of the present disclosure.
Figure 14:
Figure 14:
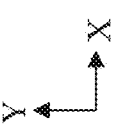
Figure 15:
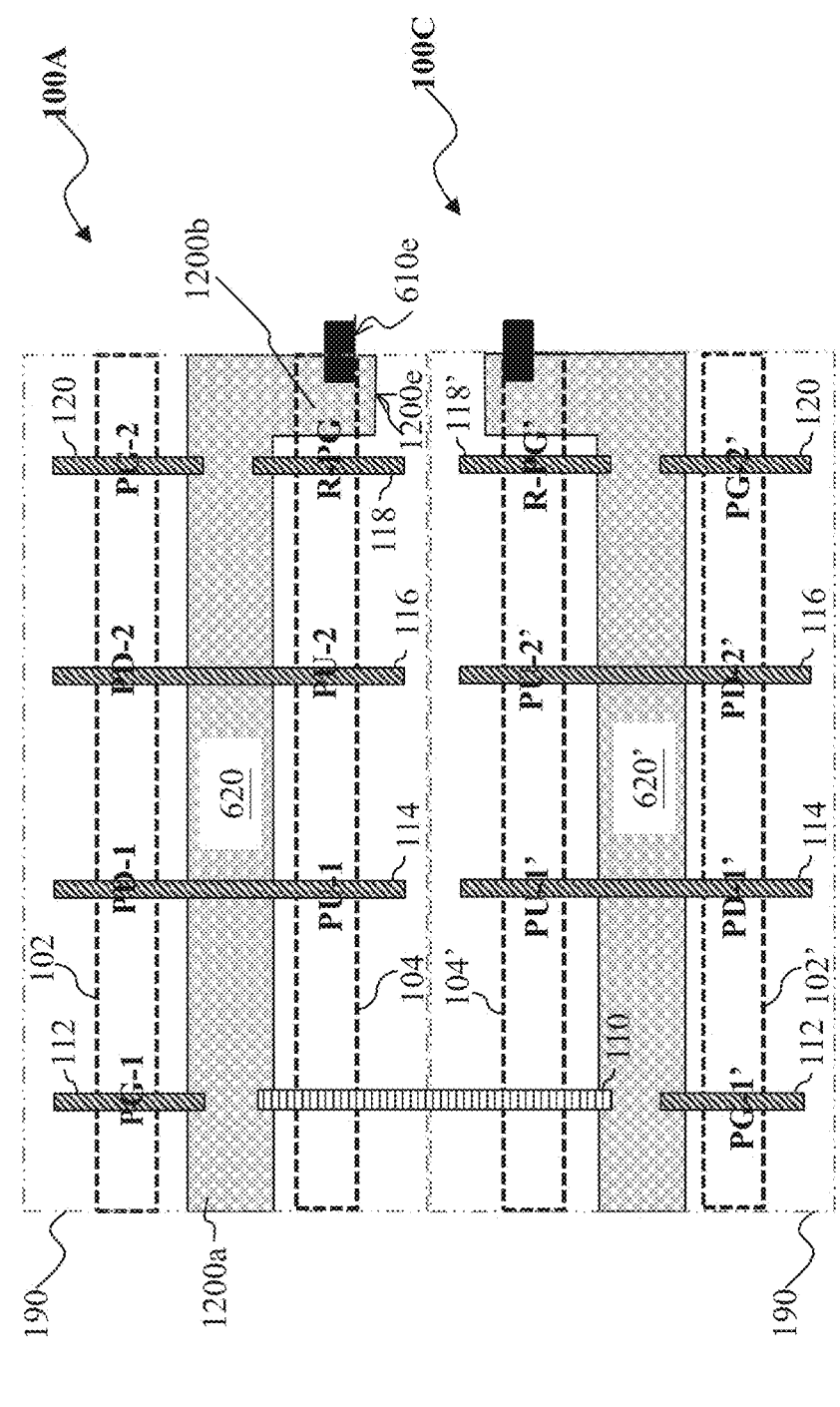
FIG. 15 illustrates a third alternative layout of various layers of the memory device in FIG. 12, in portion or entirety, according to various aspects of the present disclosure.
Figure 15:
Figure 15:
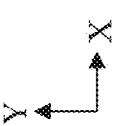
Figure 16:
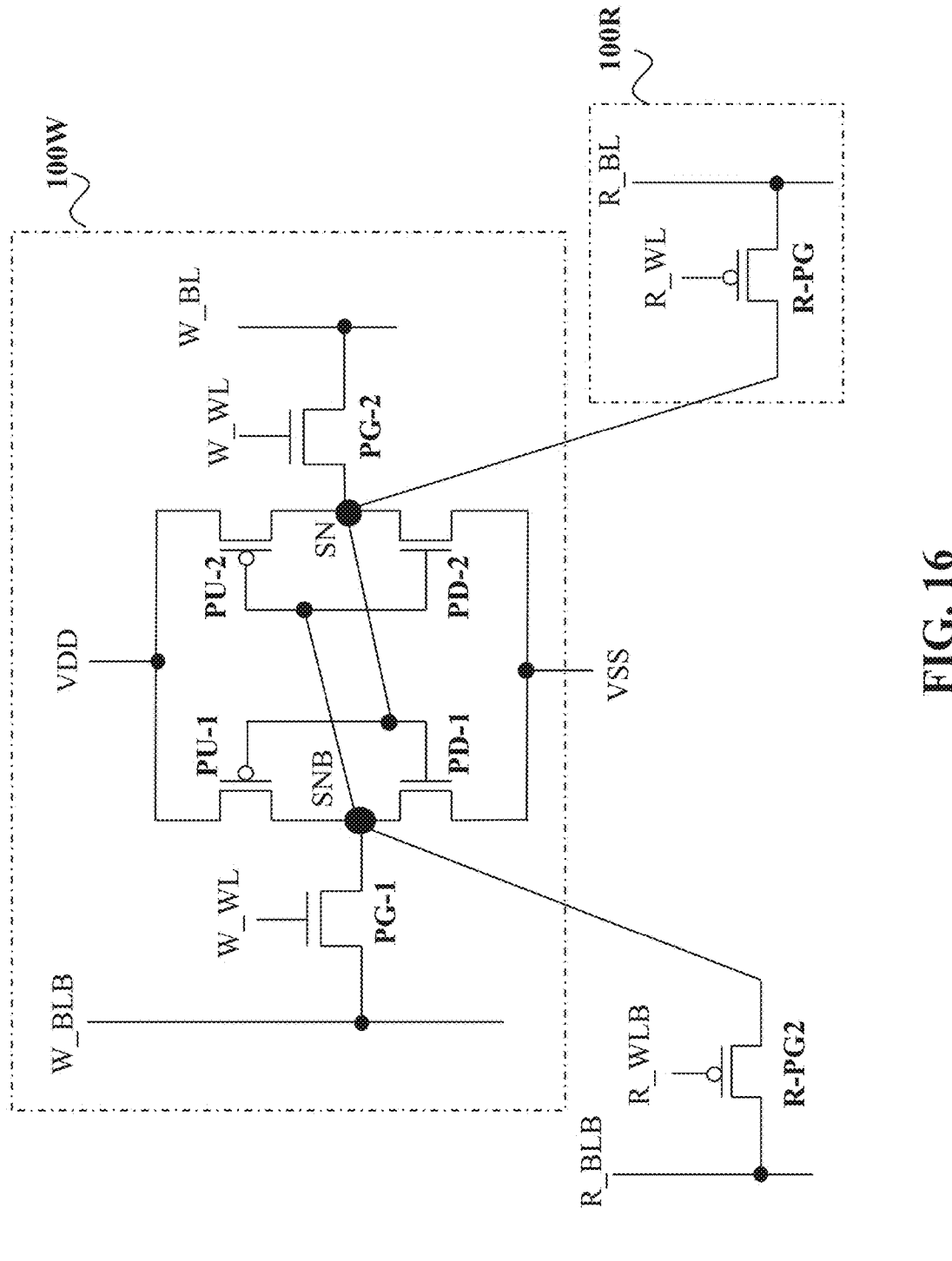
FIG. 16 is a circuit diagram of another memory cell that can be implemented in the IC chip of FIG. 1, according to various aspects of the present disclosure.

The various aspects of the present disclosure will now be described in more detail with reference to the figures. In that regard, FIG. 1A is a diagrammatic plan view of an exemplary IC chip. FIG. 1B is a diagrammatic plan view of an array of memory cells, such as static random-access memory (SRAM) cells, in portion or entirety, according to various aspects of the present disclosure. FIG. 2 is a circuit diagram of a 7T SRAM cell that can be implemented in the IC chip of FIG. 1. FIG. 3 illustrates a cross-sectional view of various layers of a memory device, in portion or entirety, according to various aspects of the present disclosure. FIGS. 4, 5, 6, 7, and 8 illustrate different portions of a layout of a memory device 1000 having the 7T SRAM cell, according to various aspects of the present disclosure. FIG. 9 illustrates a cross-sectional view of the memory device 1000 taken along line A-A' shown in FIGS. 4 and 6, in portion or entirety, according to various aspects of the present disclosure. FIG. 10 illustrates a cross-sectional view of the memory device 1000 taken along line B-B' shown in FIGS. 4-6, in portion or entirety, according to various aspects of the present disclosure. FIG. 11 illustrates an alternative layout of the memory device 1000, in portion or entirety, according to various aspects of the present disclosure. FIG. 12 illustrates a layout of various layers of a memory device 2000, in portion or entirety, according to various aspects of the present disclosure. FIG. 13 illustrates a first alternative layout of various layers of the memory device 2000, in portion or entirety, according to various aspects of the present disclosure. FIG. 14 illustrates a second alternative layout of various layers of the memory device 2000, in portion or entirety, according to various aspects of the present disclosure. FIG. 15 illustrates a third alternative layout of various layers of the memory device 2000, in portion or entirety, according to various aspects of the present disclosure. FIG. 16 is a circuit diagram of a SRAM cell having eight transistors (8T SRAM cell) that can be implemented in the IC chip of FIG. 1, according to various aspects of the present disclosure. For avoidance of doubts, the X-axis, Y-axis and Z-axis in the figures are perpendicular to one another and are used consistently throughout the present disclosure. Throughout the present disclosure, like reference numerals denote like features unless otherwise excepted. In the present disclosure, frontside features (e.g., frontside source/drain contacts, frontside source/drain vias) may be referred to as features that are formed over a top surface of a workpiece, and backside features (e.g., backside read-port bit line R_BL) may be referred to as features that are formed under a bottom surface of the workpiece.

Referring to FIG. 1A, the present disclosure provides an IC chip 10 formed over a substrate and includes at least an array 20 of memory cells. The array 20 may include static random-access memory (SRAM) cells, dynamic random-access memory (DRAM) cells, non-volatile random-access memory (NVRAM) cells, flash memory cells, other suitable memory cells, or combinations thereof. The IC chip 10 may further include a number of other components, such as an array 30 of standard logic (STD) cells configured to provide various standard logic devices, such as inverter, AND, NAND, OR, XOR, NOR, other suitable devices, or combinations thereof. Additionally, the IC chip 10 may include various passive and active microelectronic devices, such as resistors, capacitors, inductors, diodes, bipolar transistors, high voltage transistors, high frequency transistors, other suitable devices, or combinations thereof. Additional features can be added to the IC chip 10 and some of the features described below can be replaced, modified, or eliminated in other embodiments of the IC chip 10.

In the present embodiments, referring to FIG. 1B, the array 20 includes a number of SRAM cells (such as SRAM cells 100A, 100B, 100C, and 100D), which generally provide memory or storage capable of retaining data when power is applied. As such, the array 20 is hereafter referred to as an SRAM array 20. The array 20 may also be referred to as a memory device 20 or a semiconductor structure 20. In the present disclosure, the memory device 20 may include one or more SRAM cells and frontside and backside interconnect structures associated with the one or more SRAM cells. In the present embodiments, each of the SRAM cells 100A-100D includes one or more GAA transistors to be discussed in detail below.

In the present embodiments, still referring to FIG. 1B, the SRAM cells 100A, 100B, 100C, and 100D, together defining a two-by-two grid, exhibit mirror and/or rotational symmetry with respect to each other. For example, using the SRAM cell 100C as a reference (denoted "R$_0$"), a layout of the SRAM cell 100A (denoted "M$_X$") is a mirror image of a layout of the SRAM cell 100C with respect to the X-axis. Similarly, a layout of the SRAM cell 100B is a mirror image of the layout of the SRAM cell 100A, and a layout of the SRAM cell 100D (denoted "My") is a mirror image of the layout of the SRAM cell 100C, both with respect to the Y-axis. In other words, the layout of the SRAM cell 100B (denoted "R$_{180}$") is symmetric to the layout of the SRAM cell 100C by a rotation of 180 degrees about a geometric center of the grid, which is defined as an intersection point of an imaginary line bisecting the rectangular grid along the Y-axis and an imaginary line bisecting the rectangular grid along the X-axis. Furthermore, in the depicted embodiments, the SRAM cells 100A-100D are substantially the same in size, i.e., having substantially the same horizontal (long) pitch P1 along the X-axis and a vertical (short) pitch P2 along the Y-axis. As such, each of the SRAM cells 100A-100D may hereafter be referred to as the SRAM cell 100 for purposes of simplicity.

FIG. 2 illustrates an example circuit schematic for a two-port SRAM cell 100 that includes seven transistors (7T). The two-port SRAM cell 100 includes a write port portion 100W. In the present embodiments, the write port portion 100W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors. The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-1 and PD-1 are coupled together and to the common drains of the transistors PU-2 and PD-2 to form a storage node SN, and the gates of the transistors PU-2 and PD-2 are coupled together and to the common drains of the transistors PU-1 and PD-1 to form a complementary storage node SNB. Sources of the pull-up transistors PU-1 and PU-2 are coupled to a power line configured to provide a first voltage VDD (this power line may be referred to as a VDD line), and the sources of the pull-down transistors PD-1 and PD-2 are coupled to a power line configured to provide a second voltage VSS (this power line may be referred to as a VSS line), which may be an electrical ground in some embodiments.

The storage node SN of the data latch is coupled to a bit line W_BL of the write port portion 100W (may be referred to as a write bit line W_BL or a write-port bit line W_BL) through the pass-gate transistor PG-2, and the complementary storage node SNB is coupled to a complementary bit line W_BLB of the write port portion 100W (may be referred to as a complementary write bit line W_BLB or a complementary write-port bit line W_BLB) through the pass-gate transistor PG-1. The storage node SN and the complementary storage node SNB are complementary nodes that are often at opposite logic levels (logic high or logic low). Gates of the pass-gate transistors PG-1 and PG-2 are coupled to a word line W_WL of the write port portion 100W (may be referred to as a write word line W_WL or a write-port word line W_WL).

The two-port SRAM cell 100 also includes a read port portion 100R coupled to the write port portion 100W. The read port portion 100R of the SRAM cell 100 includes a read-port pass-gate transistor R-PG. One source/drain terminal of the read-port pass-gate transistor R-PG is electrically coupled to a bit line R_BL of the read port portion 100R. The bit line of the read port portion 100R may be referred to as a read-port bit line R_BL or a read bit line R_BL. The other source/drain terminal of the read-port pass-gate transistor R-PG is electrically coupled to the storage node SN (or to the gates of the transistors PU-1 and PD-1). The gate of the read-port pass-gate transistor R-PG is coupled to a word line R_WL of the read port portion 100R. The word line R_WL of the read port portion 100R may be referred to as a read word line R_WL or a read-port word line R_WL. In the illustrated embodiment, the transistor R-PG is a p-type transistor. That is, in the two-port SRAM cell 100, the pass-gate transistors in the write port portion 100W are n-type transistors, and the pass-gate transistor in read port portion 100R is a p-type transistor.

FIG. 3 is a fragmentary diagrammatic cross-sectional view of various layers (levels) that can be fabricated over a semiconductor substrate (or wafer) 60 to form a portion of a memory device, such as IC chip 10 of FIG. 1, according to various aspects of the present disclosure. As represented in FIG. 3, the various layers include a device layer DL and a multilayer interconnect structure MLI disposed over the device layer DL. Device layer DL includes devices (e.g., transistors, resistors, capacitors, and/or inductors) and/or device components (e.g., doped wells, gate structures, and/or source/drain features). In some embodiments, device layer DL includes substrate 60, doped regions 62 (e.g., n-wells and/or p-wells) disposed in substrate 60, isolation features 64, and transistors T. In the depicted embodiment, transistors T include suspended channel layers 70 and gate structures 68 disposed between source/drain features 72, where gate structures 68 wrap and/or surround suspended channel layers 70. Each gate structure 68 has a metal gate stack formed from a gate electrode 74 disposed over a gate dielectric layer 76 and gate spacers 78 disposed along sidewalls of the metal gate stack. Multilayer interconnect structure MLI electrically couples various devices and/or components of device layer DL, such that the various devices and/or components can operate as specified by design requirements for the memory device.

In the depicted embodiment, the multilayer interconnect structure MLI includes a contact interconnect layer (CO level), a via zero interconnect layer (V0 level), a metal zero (M0) interconnect layer, a via one interconnect layer (V1 level), a metal one interconnect layer (M1 level), a via two interconnect layer (V2 level), a metal two interconnect layer (M2 level), a via three interconnect layer (V3 level), and a metal three interconnect layer (M3 level). Each of the interconnect layers may be referred to as a metal interconnect layer. Metal lines formed at the M0 level may be referred to as M0 metal lines. Similarly, via or metal lines formed at the V1 level, M1 level, V2 level, M2 level, V3 level, and M3 level may be referred to as V1 vias, M1 metal lines, V2 vias, M2 metal lines, V3 vias, and M3 metal lines, respectively. The present disclosure contemplates multilayer interconnect structure MLI having more or less layers and/or levels, for example, a total number of N metal interconnect layers (levels) of the multilayer interconnect structure MLI with N as an integer ranging from 2 to 10. Each level of multilayer interconnect structure MLI includes conductive features (e.g., metal lines, metal vias, and/or metal contacts) disposed in one or more dielectric layers (e.g., an interlayer dielectric (ILD) layer and an etch stop layer (ESL)). The dielectric layers of the multilayer interconnect structure MLI are collectively referred to as a dielectric structure 66. In some embodiments, conductive features at a same level of multilayer interconnect structure MLI, such as M0 level, are formed simultaneously. In some embodiments, conductive features at a same level of multilayer interconnect structure MLI have top surfaces that are substantially planar with one another and/or bottom surfaces that are substantially planar with one another.

In embodiments represented by FIG. 3, the CO level includes source/drain contacts (MD) disposed in the dielectric structure 66. The source/drain contacts (MD) may be formed on and in direct contact with silicide layers disposed directly on source/drain features. The V0 level includes gate vias VG disposed on the gate structures and source/drain contact vias VD disposed on the source/drain contacts MD, where gate vias VG connect gate structures to M0 metal lines, source/drain vias V0 connect source/drain contacts MD to M0 metal lines. In some embodiments, the V0 level may also include butted contacts disposed in the dielectric structure 66. The V1 level includes V1 vias disposed in the dielectric structure 66, where V1 vias connect M0 metal lines to M1 metal lines. M1 level includes M1 metal lines disposed in the dielectric structure 66. V2 level includes V2 vias disposed in the dielectric structure 66, where V2 vias connect M1 metal lines to M2 metal lines. M2 level includes M2 metal lines disposed in the dielectric structure 66. V3 level includes V3 vias disposed in the dielectric structure 66, where V3 vias connect M2 metal lines to M3 metal lines. FIG. 3 has been simplified for the sake of clarity to better understand the inventive concepts of the present disclosure. Additional features can be added in the various layers of the memory, and some of the features described can be replaced, modified, or eliminated in other embodiments of the memory. FIG. 3 is merely an example and may not reflect an actual cross-sectional view of the IC chip 10 and/or the memory device 1000 that is described in further detail below.

In embodiments represented in FIGS. 2-10, the SRAM cell 100 of the memory device 1000 is electrically coupled to the write-port bit line W_BL, the complementary write-port bit line W_BLB, the write-port word line W_WL, the read-port word line R_WL, the read-port bit line R_BL, the VSS line, and the VDD line. In the present embodiments, the write-port bit line W_BL and the complementary write-port bit line W_BLB are positioned at the M2 level, and various landing pads are formed between the M2 level and the device layer DL to provide conductive paths. The read-port word line R_WL and the write-port word line W_WL are positioned in the M1 level, and various landing pads are formed between the M1 level and the device layer DL to provide conductive paths. The VSS line and VDD line are positioned at the M0 level, and various conductive features are provided in the CO level and the V0 level to provide conductive paths. In the present embodiments, as described above, to relax process windows for forming SRAM cells and conductive features (e.g., landing pads) in the multilayer interconnect structure MLI and relax limits on SRAM performance optimization, the read-port bit line R_BL is positioned under the device layer DL of the SRAM cell 100. That is, the read-port bit line R_BL is located under the backside of the SRAM cell 100, and some other signal lines and power lines such as the write-port bit line W_BL, the complementary write-port bit line W_BLB, the write-port word line W_WL, the read-port word line R_WL, the VSS line, and the VDD line and associated landing pads are formed over the frontside of the SRAM cell 100.

Figure 4:
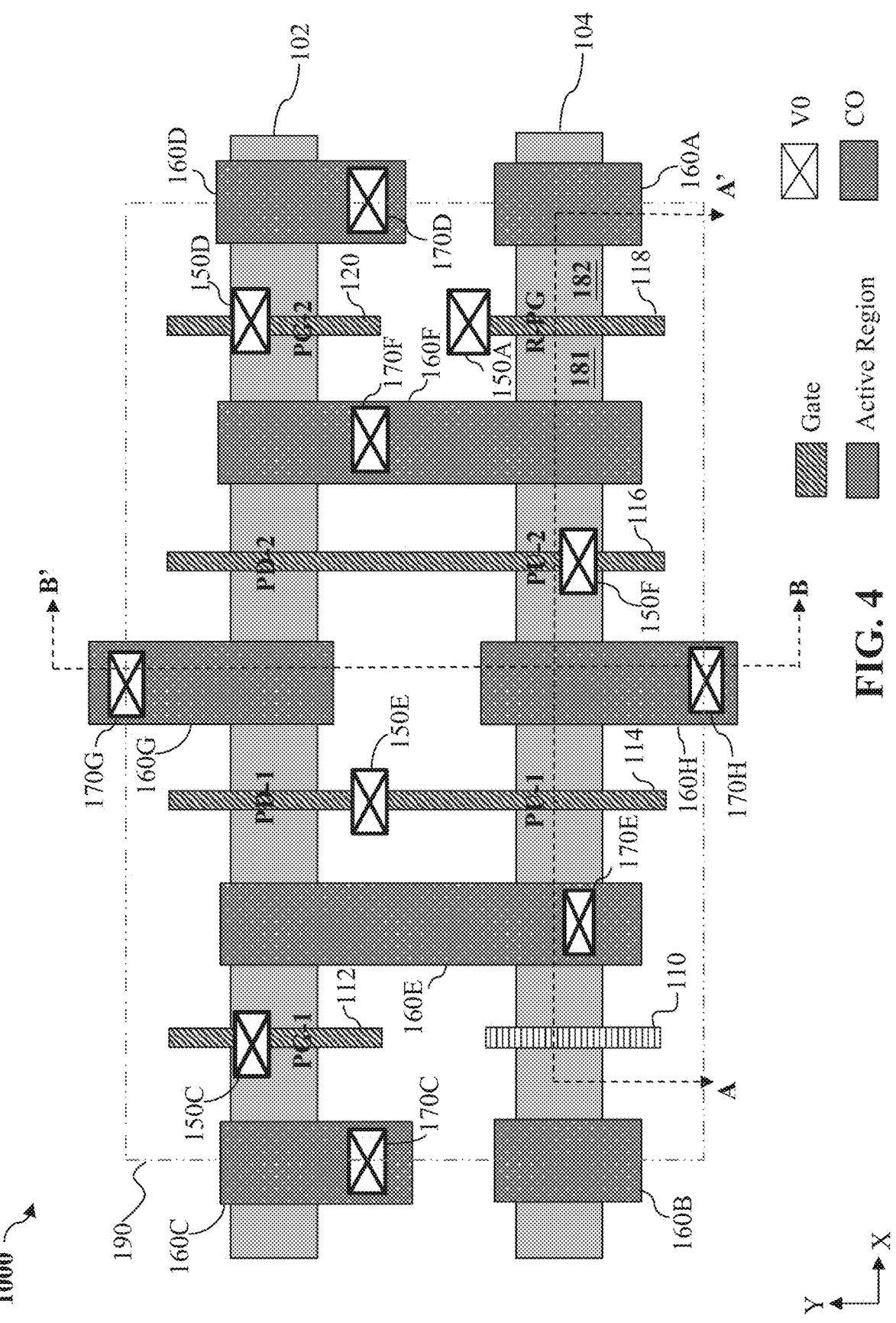
FIGS. 4, 5, 6, 7, and 8 illustrate different portions of a layout of a memory device having the SRAM cell of FIG. 2, according to various aspects of the present disclosure.
Figure 5:
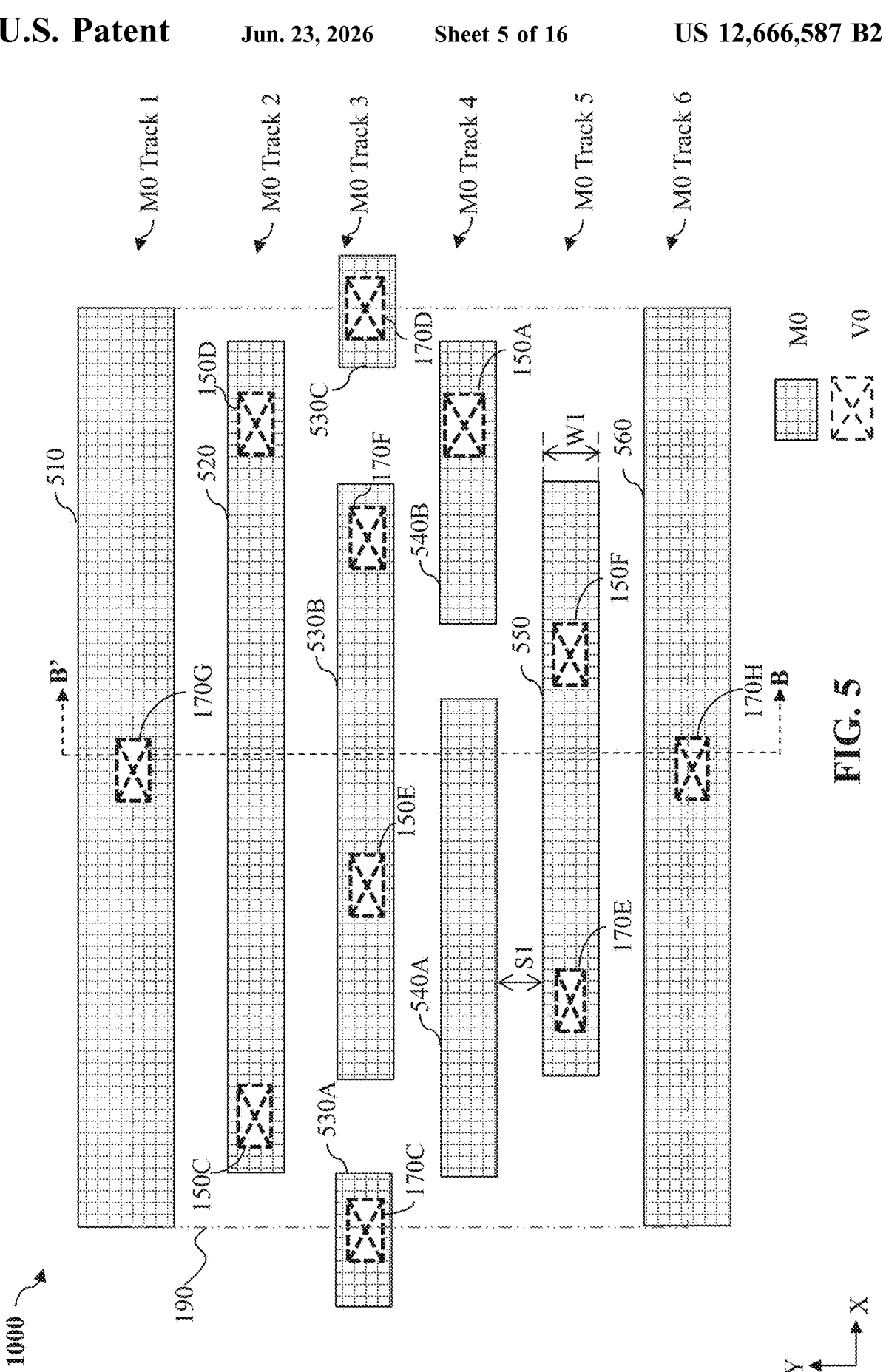
Figure 6:
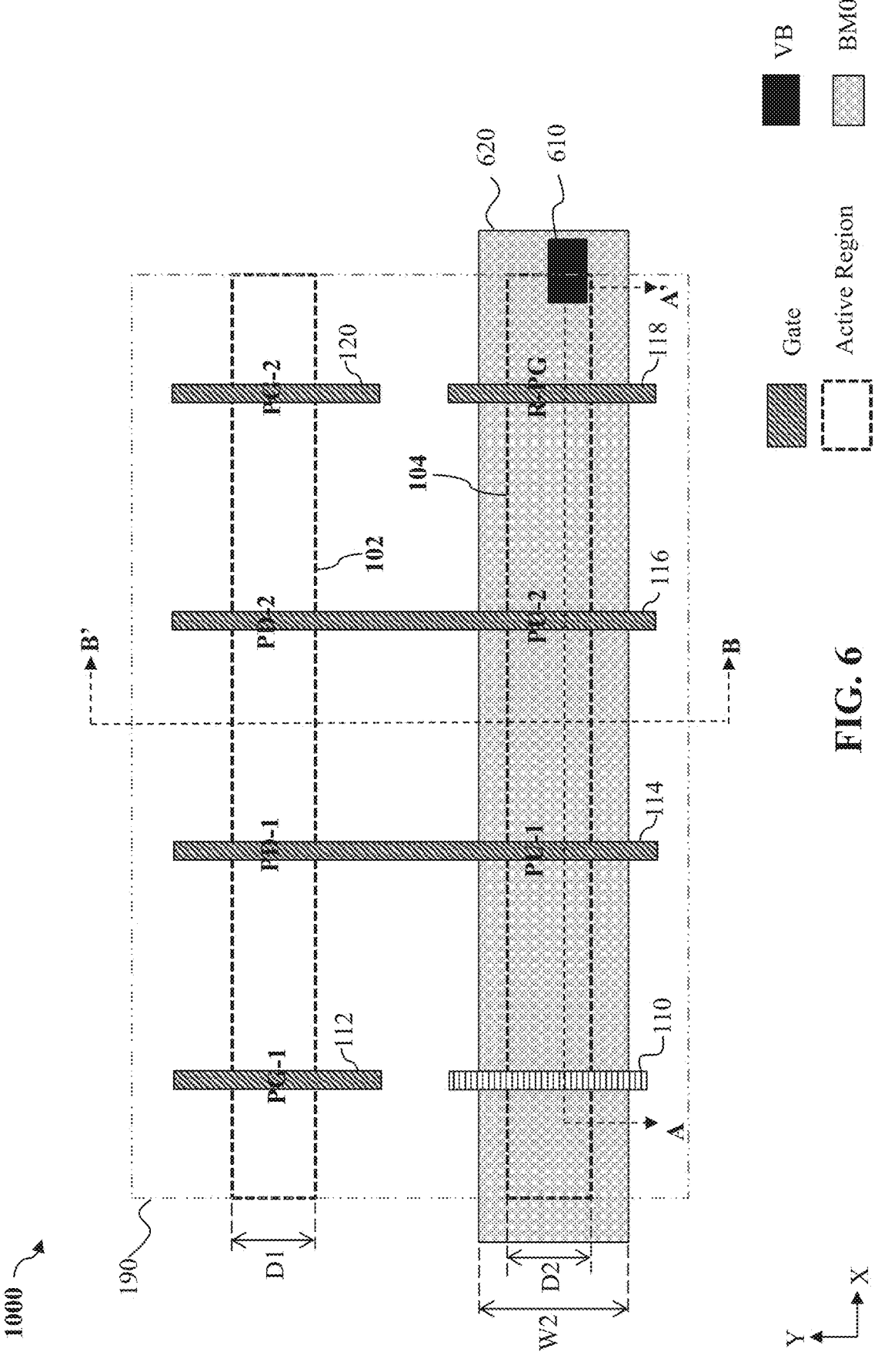
Figure 7:
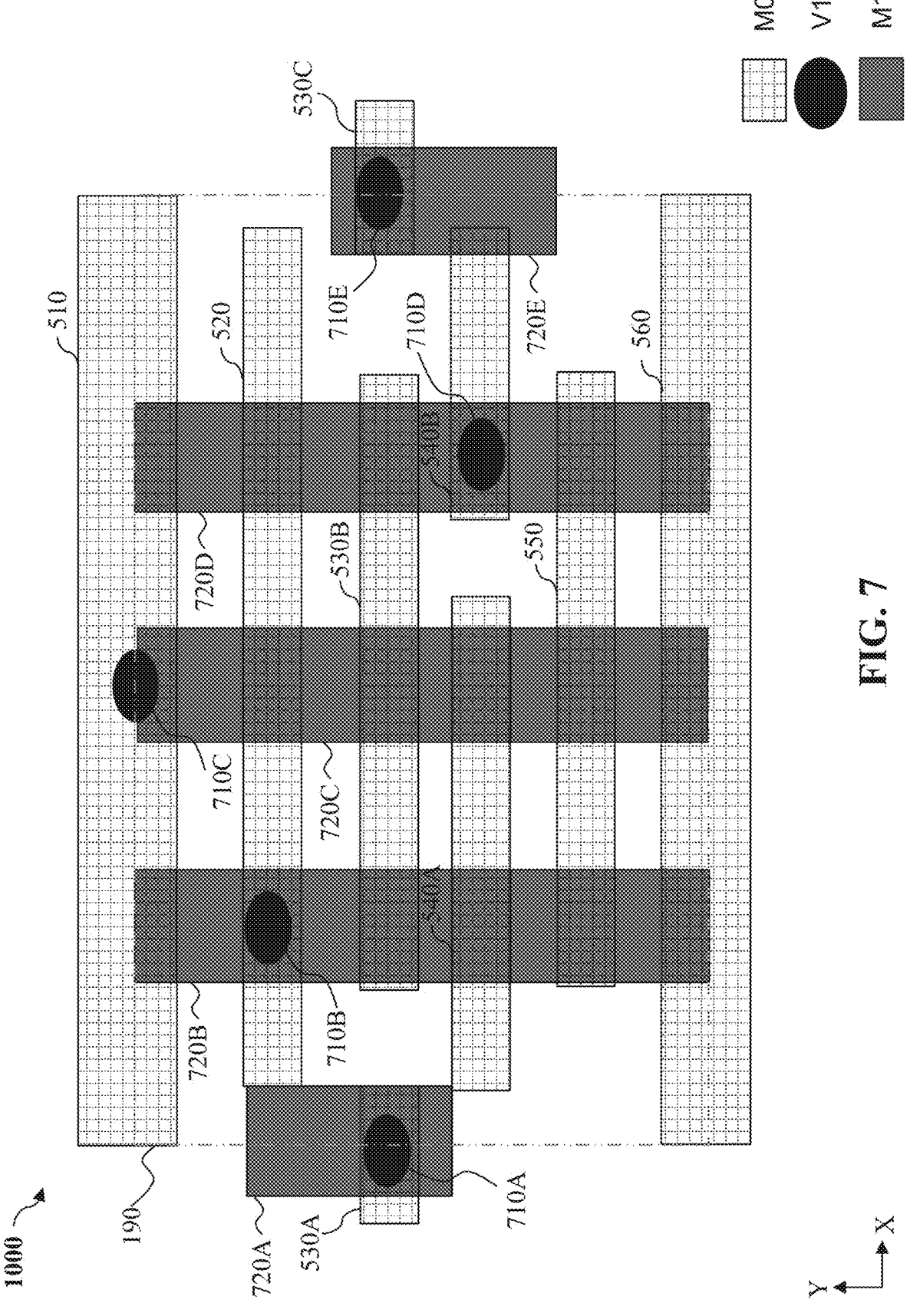
Figure 8:
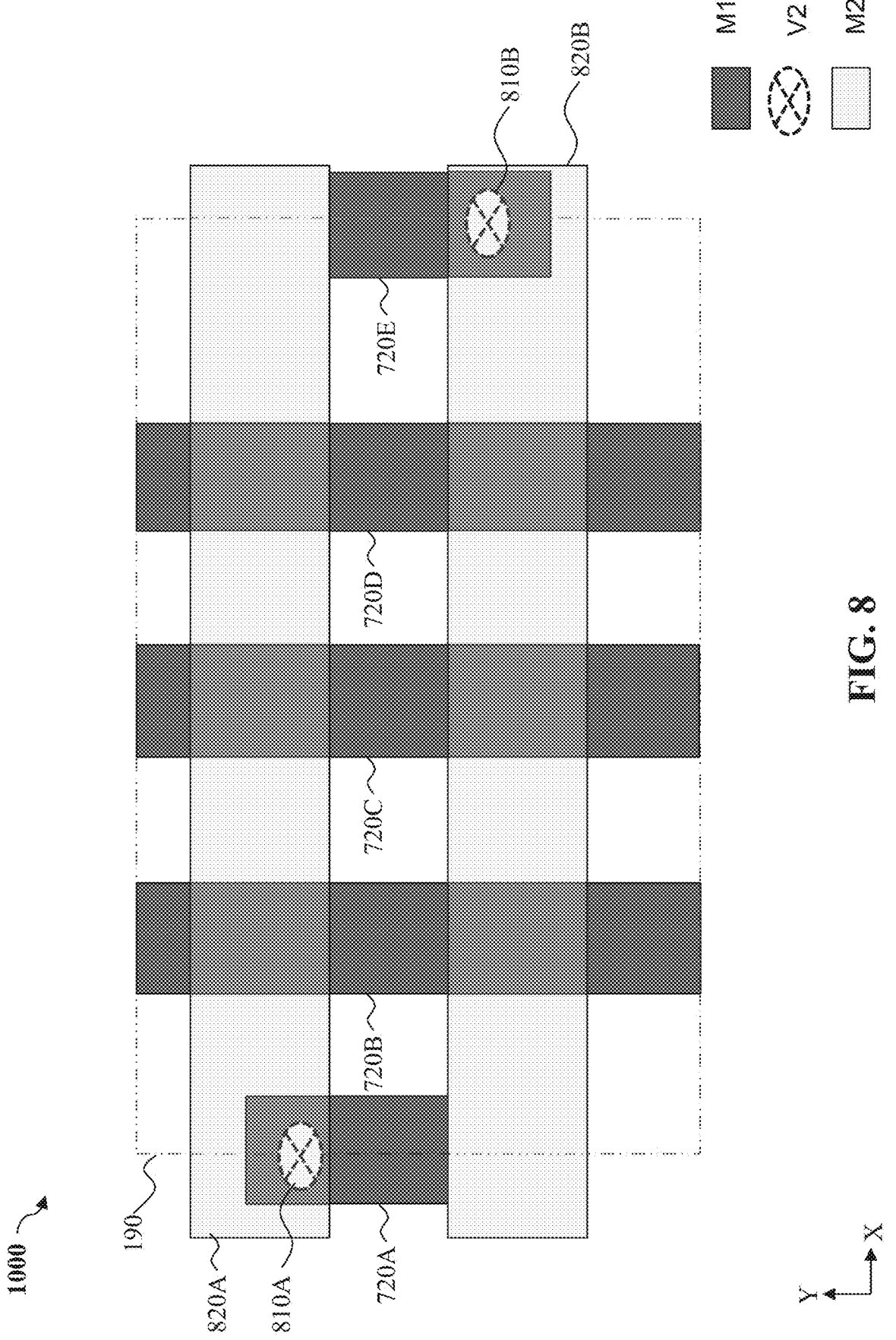

FIGS. 4, 5, 6, 7, and 8 illustrate portions of a layout of a memory device 1000 including the two-port SRAM cell 100 of FIG. 2, in accordance with some embodiments of the present disclosure. More specifically, FIG. 4 illustrates the layout of the device layer DL, CO level, and V0 level of memory device 1000, FIG. 5 illustrates the layout of the V0 level and M0 level of the memory device 1000, FIG. 6 illustrates a fragmentary portion of a layout of the device layer DL and backside metal interconnect layer(s) of the memory device 1000, FIG. 7 illustrates a fragmentary portion of a layout of the M0 level, V1 level, and M1 level of the memory device 1000, and FIG. 8 illustrates a fragmentary portion of a layout of the M1 level, V2 level, and M2 level of the memory device 1000. FIG. 9 illustrates a fragmentary cross-sectional view of the memory device taken along line A-A' in FIGS. 4 and 6, in accordance with some embodiments of the present disclosure. FIG. 10 illustrates a fragmentary cross-sectional view of the memory device taken along line B-B' shown in FIGS. 4-6, in accordance with some embodiments of the present disclosure.

Reference is first made to FIG. 4. At the device layer DL, the two-port SRAM cell 100, which is a portion of the memory device 1000, includes active regions 102 and 104 over a substrate 902. In embodiments presented by FIG. 4, the active regions 102 and 104 each extend lengthwise along the X-axis and spaced apart from each other along the Y-axis by an isolation structure 904 (e.g., shallow trench isolation (STI) features). In the present embodiments, the active region 102 is a three-dimensional fin-like active region (hereafter referred to as an N-type fin 102) disposed in a doped region or well (e.g., P-well, not illustrated) and configured to provide channel regions of N-type transistors, such as a pull-down transistor or a pass-gate transistor, and the active region 104 is a three-dimensional fin-like active region (hereafter referred to as P-type fin 104) disposed in another doped region (e.g., N-well, not illustrated) and configured to provide channel regions of P-type transistors, such as pull-up transistors. In an embodiment, each of the N-type fin 102 and the P-type fin 104 includes a set of vertically stacked semiconductor layers (e.g., semiconductor layers 908 shown in FIG. 9) or nanostructures.

Still referring to FIG. 4, the SRAM cell 100 also includes gate structures, such as gate structures 112, 114, 116, 118 and 120, oriented lengthwise along the Y-axis and disposed over the N-type fin 102 and/or the P-type fin 104 to form various transistors. Each of the gate structures 112, 114, 116, 118 and 120 traverses a channel region of the N-type fin 102 and/or a channel region of the P-type fin 104. In the depicted embodiments, referring to FIG. 4 as an example, the gate structure 112 engages the N-type fin 102 to form the pass-gate transistor PG-1. The gate structure 114 engages the N-type fin 102 and the P-type fin 104 to form the pull-down transistor PD-1 and the pull-up transistor PU-1, respectively. The gate structure 116 engages the N-type fin 102 and the P-type fin 104 to form the pull-down transistor PD-2 and the pull-up transistor PU-2, respectively. The gate structure 118 engages the P-type fin 104 to form the read-port pass-gate transistor R-PG. The gate structure 120 engages the N-type fin 102 to form the pass-gate transistor PG-2. In an embodiment, the gate structure 118 and the gate structure 120 are portions of a continuous gate structure similar to the gate structure 114/116. To fulfill desired functions, an isolation structure may be formed to cut the continuous gate structure into two electrically and physically isolated portions. That is, sidewalls of the gate structures 118 and 120 are aligned along the Y-axis. In the present embodiments, the pull-up transistors PU-1, the PU-2, and the read-port pass-gate transistor R-PG are P-type GAA transistors, and the pull-down transistors PD-1 and PD-2, the pass-gate transistor PG-1, and PG-2 are N-type GAA transistors. The area utilization at the device layer DL of the SRAM cell 100 is considered efficient as there is only one unit area not utilized for forming a functional transistor but hosting an intersection of a dielectric feature 110 and an active region instead. A boundary 190 of the two-port SRAM cell 100 is illustrated using broken lines. Note that at least some of the active regions 102, 104 and gate structures 112, 114, 116, 118 and 120 may extend beyond the illustrated boundary 190, since these active regions and gate structures may also form components of other adjacently located SRAM cells as well.

Still referring to FIG. 4, the memory device 1000 includes conductive features at the CO level and V0 level formed over the SRAM cell 100. A gate via 150A is formed on the gate structure 118 of the read-port pass-gate transistor R-PG and is configured to electrically connect the gate structure 118 of the read-port pass-gate transistor R-PG to the read-port word line R_WL. A gate via 150C is formed on the gate structure 112 of the pass-gate transistor PG-1 and is configured to electrically connect the gate structure 112 of the pass-gate transistor PG-1 to the write-port word line W_WL. A gate via 150D is formed on the gate structure 120 of the pass-gate transistor PG-2 and is configured to electrically connect the gate structure 120 of the pass-gate transistor PG-2 to the write-port word line W_WL. A gate via 150E is formed on the gate structure 114 and electrically connects the gate structure 114 to the storage node (SN) positioned at a higher metal level. A gate via 150F is formed on the gate structure 116 and electrically connects the gate structure 116 to the complementary storage node (SNB) positioned at a higher metal level.

Still referring to FIG. 4, at the CO level and V0 level, the memory device 1000 also includes a dummy source/drain contact 160A landing on a source/drain feature 182 of the pass-gate transistor R-PG and staying electrically floating, as there is no corresponding source/drain contact via landing thereon. The memory device 1000 also includes another dummy source/drain contact 160B adjacent to the dielectric feature 110 and staying electrically floating. A source/drain contact 160C and a source/drain contact via 170C landing thereon electrically connect a source region of the pass-gate transistor PG-1 to the complementary write-port bit line (W_BLB). A source/drain contact 160D and a source/drain contact via 170D landing thereon electrically connect a source region of the pass-gate transistor PG-2 to the write-port bit line (W_BL). A source/drain contact 160E and a source/drain contact via 170E landing thereon electrically connect a common drain region of the pass-gate transistor PG-1 and the pull-down transistor PD-1 together with a drain region of the pull-up transistor PU-1 to the complementary storage node (SNB). A source/drain contact 160F and a source/drain contact via 170F landing thereon electrically connect a common drain region of the pass-gate transistor PG-2 and the pull-down transistor PD-2 together with a common drain region of the pull-up transistor PU-2 and the read-port pass-gate transistor R-PG to the storage node (SN). A source/drain contact 160G and a source/drain contact via 170G landing thereon electrically connect a common source region of the pull-down transistor PD-1 and the pull-down transistor PD-2 to the VSS line. A source/drain contact 160H and a source/drain contact via 170H landing thereon electrically connect a common source region of the pull-up transistor PU-1 and the pull-up transistor PU-2 to the VDD line. In the illustrated embodiment, the source/drain contacts 160A-160H each are elongated and have a longitudinal direction in the Y-axis, which is parallel to the extending directions of the gate structures 112-120.

The storage node SN includes the gate via 150E and the source/drain contact via 170F positioned on two opposing sides of the gate structure 116. As will be described in further detail below, a metal line at the M0 level extends along the X-axis to connect the gate via 150E and the source/drain contact via 170F. In other words, an M0 metal line hangs over the gate structure 116 and provides the function of cross coupling between the gate via 150E and the source/drain contact via 170F. Therefore, in the layout, the gate via 150E and the source/drain contact via 170F are positioned as being level along the Y-axis, such that a metal line extending along the X-axis may connect both. Similarly, the complementary storage node (storage node bar) SNB includes the gate via 150F and the source/drain contact via 170E positioned on two opposing sides of the gate structure 114. As will be described in further detail below, another metal line at the M0 level extends along the X-axis to across the gate structure 114 and connect the gate via 150F and the source/drain contact via 170E. In other words, another M0 metal line hangs over the gate structure 114 and provides the function of cross coupling between the gate via 150F and the source/drain contact via 170E. Therefore, in the layout, the gate via 150F and the source/drain contact via 170E are positioned as being level along the Y-axis, such that a metal line extending along the X-axis may connect both.

Reference is now made to FIG. 5. The memory device 1000 includes conductive features at the M0 level formed over the SRAM cell 100. FIG. 5 illustrates the V0 level and M0 level of the layout of the multilayer interconnect structure of the memory device 1000. At the M0 level, the memory device 1000 includes a number of metal tracks arranged in parallel. Particularly, in the illustrated embodiment of the layout, the memory device 1000 includes six metal tracks arranged in order from first (M0 Track 1) to sixth (M0 Track 6) along the Y-axis. In the present disclosure, metal lines having longitudinal dimensions less than dimensions of the SRAM cell 100, such as dimensions along the X-axis that are less than cell width and dimensions along the Y-axis that are less than cell height, are referred to as local metal lines, and metal lines having longitudinal dimensions no less than dimensions of the SRAM cell 100, such as dimensions along the X-axis that are less than cell width along the X-axis and dimensions along the Y-axis that are less than cell height along the Y-axis, are referred to as global metal lines.

As depicted in FIG. 5, the first metal track "M0 Track 1" includes a global metal line 510, which is the VSS line, disposed on and electrically coupled to the source/drain contact via 170G. The VSS line 510 is disposed on an upper edge of the SRAM cell 100 and may be shared with an adjacent SRAM cell.

The second metal track "M0 Track 2" includes a local metal line 520 as a landing pad for the write-port word line W_WL positioned at a higher metal level. In a top view, the local metal line 520 is fully within the boundary 190 of the SRAM cell 100. The local metal line 520 is disposed over and in direct contact with the gate via 150C and the gate via 150D.

The third metal track "M0 Track 3" includes three local metal lines 530A, 530B, and 530C. The local metal line 530A provides a landing pad for the write-port complimentary bit line W_BLB positioned at a higher metal level. In the top view, the local metal line 530A extends beyond a left edge of the SRAM cell 100 and may be shared with an adjacent SRAM cell. In the top view, the local metal line 530B is fully within the boundary 190 of the SRAM cell 100, which belongs to the storage node (SN) and provides cross-coupling between the gate via 150E and the source/drain contact via 170F. As described above, when viewed from top, the local metal line 530B crosses over the gate structure 116. The local metal line 530C provides a landing pad for the write-port bit line W_BL positioned at a higher metal level. In the top view, the local metal line 530C extends beyond a right edge of the SRAM cell 100 and may be shared with an adjacent SRAM cell.

The fourth metal track "M0 Track 4" includes two local metal lines 540A and 540B. In the top view, the local metal line 540A is fully within the boundary 190 of the SRAM cell 100 and is electrically floating. Therefore, the local metal line 540A is a non-functional metal line, which is mainly for improving metal density uniformity in the layout. The local metal line 540B provides a landing pad for the read-port word line R_WL positioned at a higher metal level. In the top view, the local metal line 540B is fully within the boundary 190 of the SRAM cell 100.

The fifth metal track "M0 Track 5" includes one local metal line 550. In the top view, the local metal line 550 is fully within the boundary 190 of the SRAM cell 100, which belongs to the complementary storage node (SNB) and provides cross-coupling between the gate via 150F and the source/drain contact via 170E. As described above, when viewed from top, the local metal line 550 crosses over the gate structure 116. Each of the metal lines 520, 530A-530C, 540A-540B, 550 and 560 has a same width W1 along the Y-axis.

The sixth metal track "M0 Track 6" includes a global metal line 560, which is the VDD line, electrically coupled to the source/drain contact via 170H. The VDD line 560 is disposed directly over a lower edge of the SRAM cell 100 and may be shared with an adjacent SRAM cell. In the depicted embodiment, the local metal lines (e.g., the local metal lines 520, 530A, 530C, 540A-540B) in the M0 level have longitudinal dimensions along the X-axis that are large enough to provide a sufficient landing area for their overlying vias (and thus minimize overlay issues and provide greater patterning flexibility). In the depicted embodiment, landing pads at the M0 level have longitudinal dimensions that are less than dimensions of the SRAM cell 100, such as dimensions along the X-axis that are less than cell width W and dimensions along the Y-direction that are less than cell height H. As a comparison to the landing pads, the VSS line 510 and the VDD line 560 have longitudinal dimensions along the X-axis that are greater than cell width of the SRAM cell 100.

Reference is now made to FIG. 6. The memory device 1000 also includes conductive features formed under the SRAM cell 100. As described with reference to FIGS. 2 and 4, the read-port pass-gate transistor R-PG has the source/drain feature 181 electrically coupled to the drains of the transistors PU-2 and PD-2 and the source/drain feature 182 electrically connected to the read-port bit line R_BL. In the present embodiments, to increase the design flexibility of metal lines at the M0 level and alleviate leakage and overlay issues, as described above, instead of forming the read-port bit line R_BL and its landing pad(s) over the device layer DL of the SRAM cell 100, a source/drain contact via 610 is formed directly under the source/drain feature 182 of the read-port pass-gate transistor R-PG to electrically connect the source/drain feature 182 to a metal line 620, which is the read-port bit line R_BL, disposed under the source/drain contact via 610. The source/drain contact via 610 may be referred to as a backside contact via 610 or backside contact via VB, and the metal line 620 may be referred to as a backside metal line 620 or backside metal line BMO. By forming the backside contact via 610 and the read-port bit line R_BL (i.e., the backside metal line 620) under the source/drains and gates of the read-port pass-gate transistor R-PG, leakage and short issue associated with the landing pad(s) of the read-port bit line R_BL may be alleviated, metal lines in the M0 level may be relaxed, and the design flexibility of the metal lines (including the landing pads) in the M0 level may be increased accordingly. In an embodiment, the metal line 620 is a global metal line and its length along the X-axis is greater than the cell width. The metal line 620 has a width W2 along the Y-axis. A ratio of the width W2 to the width W1 (i.e., W2/W1) may be in a range between about 0.3 and about 5. The N-type fin 102 has a width D1 along the Y-axis and the P-type fin 104 has a width D2 along the Y-axis. The width D2 may be equal to or different than the width D1. In some embodiments, a ratio of the width W2 to the width D2 (i.e., W2/D2) may be in a range between about 0.3 and about 2. The backside contact via 610 and the backside metal line 620 are described in further detail with reference to the cross-sectional views of the memory device 1000 depicted in FIGS. 9-10.

Reference is now made to FIG. 7, which illustrates the M0 level, V1 level, and M1 level of the layout of the multilayer interconnect structure of the memory device 1000. At the V1 level, the memory device 1000 includes a number of vias formed over and in direct contact with the M0 level. For example, the V1 level of the memory device 1000 includes a via 710A formed over and in direct contact with the local metal line 530A and electrically coupling the local metal line 530A to the complementary write-port bit line W_BLB positioned at a higher metal interconnect layer. The V1 level of the memory device 1000 also includes a via 710B formed over and in direct contact with the local metal line 520 and electrically coupling the local metal line 520 to the write-port word line W_WL positioned at a higher metal interconnect layer. The V1 level of the memory device 1000 also includes a via 710C formed over and in direct contact with the global metal line 510 and electrically coupling the global metal line 510 to a metal line positioned at a higher metal interconnect layer. The V1 level of the memory device 1000 also includes a via 710D formed over and in direct contact with the local metal line 540B and electrically coupling the local metal line 540B to the read-port word line R_WL positioned at a higher metal interconnect layer. The V1 level of the memory device 1000 also includes a via 710E formed over and in direct contact with the local metal line 530C and electrically coupling the local metal line 530C to the write-port bit line W_BL positioned at a higher metal interconnect layer.

At the M1 level, the memory device 1000 includes a number of metal lines formed over the V1 level. For example, the M1 level of the memory device 1000 includes a local metal line 720A formed over and in direct contact with the via 710A and electrically coupling the via 710A to the complementary write-port bit line W_BLB positioned at a higher metal interconnect layer. The local metal line 720A may also be referred to as a landing pad for the complementary write-port bit line W_BLB. The local metal line 720A may extend beyond a left edge of the SRAM cell 100 and may be shared with an adjacent SRAM cell.

The M1 level of the memory device 1000 also includes a global metal line 720B, which is the write-port word line W_WL, disposed on and electrically coupled to the via 710B. The write-port word line W_WL may extend beyond the upper edge and/or the lower edge of the SRAM cell 100 and may be shared between adjacent SRAM cells. The M1 level of the memory device 1000 also includes a global metal line formed over and in direct contact with the via 710C. The M1 level of the memory device 1000 also includes a global metal line 720D, which is the read-port word line R_WL, disposed on and electrically coupled to the via 710D. The read-port word line R_WL may extend beyond the upper edge and/or the lower edge of the SRAM cell 100 and may be shared between adjacent SRAM cells. The M1 level of the memory device 1000 includes a local metal line 720E formed over and in direct contact with the via 710E and electrically coupling the via 710E to the write-port bit line W_BL positioned at a higher metal interconnect layer. The local metal line 720E may also be referred to as a landing pad for the write-port bit line W_BL. The local metal line 720A may extend beyond a right edge of the SRAM cell 100 and may be shared with an adjacent SRAM cell.

As depicted in FIG. 7, in the top view, all the metal lines (including the global metal lines 720B, 720C, 720D and the local metal lines 720A, 720E) at the M1 level extend lengthwise along the Y-axis. In an embodiment, since the read-port bit line R_BL is placed at the back side of the memory cell and no landing pad for the read-port bit line R_BL is formed over the memory cell 100, as illustrated in FIG. 7, the local metal line 720E may be vertically overlapped with the local metal line 540B.

Reference is now made to FIG. 8, which illustrates the M1 level, V2 level, and M2 level of the layout of the multilayer interconnect structure of the memory device 1000. At the V2 level, the memory device 1000 includes a number of vias formed over the M1 level. For example, the V2 level of the memory device 1000 includes a via 810A formed over and in direct contact with the local metal line 720A and electrically coupling the local metal line 720A to the complementary write-port bit line W_BLB positioned at a higher metal interconnect layer. The V2 level of the memory device 1000 also includes a via 810B formed over and in direct contact with the local metal line 720E and electrically coupling the local metal line 720E to the write-port bit line W_BL positioned at a higher metal interconnect layer.

At the M2 level, the memory device 1000 includes a number of metal lines formed over the V2 level. In the present embodiments, the memory device 1000 includes a global metal line 820A, which is the complementary write-port bit line W_BLB, formed over and in direct contact with the via 810A. The memory device 1000 includes a global metal line 820B, which is the write-port bit line W_BL, formed over and in direct contact with the via 810B. The write-port bit line W_BL and the complementary write-port bit line W_BLB both extend lengthwise along the X-axis, may extend beyond the left edge and/or the right edge of the SRAM cell 100, and may be shared with an adjacent SRAM cell. In some existing technologies, the read_port bit line RBL may be formed over the SRAM cell and also at the M2 level. Thus, in the present embodiments, forming the read-_port bit line RBL under the SRAM cell may relax the design flexibility of the write-port bit line W_BL and the complementary write-port bit line W_BLB. For example, widths of the write-port bit line W_BL and the complementary write-port bit line W_BLB may be increased, and parasitic resistance may be reduced and write speed of the memory device may be advantageously increased.

Compared with embodiments in which the read_port bit line RBL is formed over the SRAM cell (e.g., formed at the M2 level along with the write-port bit line W_BL and the complementary write-port bit line W_BLB), forming the read-port bit line RBL under the SRAM cell may relax the design flexibility of the write-port bit line W_BL and the complementary write-port bit line W_BLB. For example, widths of the complementary write-port bit line W_BLB and the write-port bit line W_BL in the present embodiments may be increased, thus, parasitic resistance may be reduced and write speed of the memory device may be advantageously increased. In some embodiments, as depicted in FIG. 8, to reduce a parasitic capacitance, the metal line 720A and the write-port bit line W_BL are not vertically overlapped, and the metal line 720E and the complementary write-port bit line W_BLB are not vertically overlapped.

FIG. 9 illustrates a cross-sectional view of the memory device 1000 taken along line A-A' in FIGS. 4 and 6, in accordance with some embodiments of the present disclosure. FIG. 10 illustrates a cross-sectional view of the memory device 1000 taken along line B-B' shown in FIGS. 4-6, in accordance with some embodiments of the present disclosure. A cross-sectional view of the memory device 1000 cut through the N-type fin 102 and the gate structures 112, 114, 116, and 120 is similar to the cross-sectional view of the memory device 1000 shown in FIG. 9 and repeated description is omitted for reason of simplicity.

As depicted in FIGS. 9-10, the SRAM cell 100 (as a portion of the memory device 1000) is formed over a substrate (or a wafer) 902. In an embodiment, the substrate 902 includes silicon. The substrate 902 includes a number of p-wells (not shown) and n-wells (not shown) formed therein (and/or thereover) according to various design requirements of the memory device 1000. The n-well is configured to provide at least one p-type field-effect transistor (PFET), such as a pull-up transistor, and the p-well is configured to provide at least one n-type field-effect transistor (NFET), such as a pull-down transistor or a pass-gate transistor. In some embodiments, the substrate 902 may include additional doped regions configured to provide one or more transistors according to design requirements of the memory device 1000.

In the present embodiments represented by FIGS. 9-10, the transistors (e.g., the pull-up transistors PU-1 and PU-2, the pull-down transistors PD-1 and PD-2, the pass gate transistors PG-1, PG-2, and R-PG) of the SRAM cell 100 include GAA transistors, the P-type fin 104 includes a stack of semiconductor layers 908; similarly, and the N-type fin 102 includes a stack of semiconductor layers. In the depicted embodiments, the semiconductor layers 908 are stacked vertically along the Z-axis. Each stack of the semiconductor layers 908 of the P-type fin 104 interposes P-type source/drain (S/D) features 910P, and each stack of the semiconductor layers of the N-type fin 102 interposes N-type source/drain (S/D) features 910N (shown in FIG. 10). The semiconductor layers 908 may include Si, Ge, SiC, SiGe, GeSn, SiGeSn, SiGeCSn, other suitable semiconductor materials, or combinations thereof. In the present embodiments, each of the semiconductor layers 908 includes a nanosheet, a nanowire (e.g., a nanowire having a hexagonal cross-section), a nanorod (e.g., a nanorod having a square or round cross-section), or other suitable configurations. In some embodiments, the N-type fin 102 and the P-type fin 104 each include two to ten channel layers 908, respectively. For example, the N-type fin 102 and the P-type fin 104 2 may each include three channel layers 908. Of course, the present disclosure is not limited to such configurations and the number of semiconductor layers may be tuned according to design requirements for the memory device 1000.

The SRAM cell 100 also includes N-type source/drain features 910N (shown in FIG. 10) coupled to the channel layers of the N-type fin 102 and P-type source/drain features 910P coupled to the channel layers of the P-type fin 104. Source/drain feature(s) may refer to a source or a drain, individually or collectively dependent upon the context. Exemplary N-type source/drain features 910N may include silicon, phosphorus-doped silicon, arsenic-doped silicon, antimony-doped silicon, or other suitable material and may be in-situ doped during the epitaxial process by introducing an N-type dopant, such as phosphorus, arsenic, or antimony, or ex-situ doped using a junction implant process. Exemplary P-type source/drain features 910P may include germanium, gallium-doped silicon germanium, boron-doped silicon germanium, or other suitable material and may be in-situ doped during the epitaxial process by introducing a P-type dopant, such as boron or gallium, or ex-situ doped using a junction implant process. In some embodiments, the N-type source/drain features 910N and/or the P-type source/drain features 910P each may be a multi-layer structure that includes an undoped semiconductor layer, a lightly doped semiconductor layer over the undoped semiconductor layer, and a heavily doped semiconductor layer over the lightly doped semiconductor layer.

In the present embodiments, each gate structure (including the gate structures 112, 114, 116, 118, 120) includes at least a high-k gate dielectric layer (e.g., the gate dielectric layer 76 shown in FIG. 3) and a metal gate electrode (e.g., the gate electrode 74 shown in FIG. 3). In the present embodiments, portions of the high-k gate dielectric layer wrap around each channel layer, such that each gate structure engages the plurality of channel layers (e.g., channel layers 908) in each GAA transistor. The high-k gate dielectric layer may include silicon oxynitride, aluminum silicon oxide, a high-k dielectric material such as hafnium oxide, zirconium oxide, lanthanum oxide, titanium oxide, yttrium oxide, strontium titanate, other suitable dielectric materials, or combinations thereof. Though not depicted, each metal gate electrode may further include a bulk conductive layer disposed over at least one work function metal layer. The bulk conductive layer may include Cu, W, Ru, Co, Al, Ti, Ta, other suitable metals, or combinations thereof. In some examples, each gate structure may include one or more work function metal layer of the same conductivity type or of different conductivity types. Examples of the work function metal layers may include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. Various work function metal layers may be first deposited and then patterned to satisfy different requirements of threshold voltage in different GAA FETs. Additional material layers may also be included in each gate structure, such as an interfacial layer, a barrier layer, a capping layer, other suitable materials layers, or combinations thereof. Various layers of the gate structures may be deposited by any suitable method, such as chemical oxidation, thermal oxidation, atomic layer deposition (ALD), chemical vapor deposition (CVD), physical vapor deposition (PVD), plating, other suitable methods, or combinations thereof. The SRAM cell 100 may further include top spacers 912a and 912b and inner spacers 912c disposed on sidewalls of the gate structures, where the top spacers 912a and 912b are disposed over the channel layers 908 and the inner spacers 912c are disposed in the space between two vertically stacked channel layers 908. As depicted in FIG. 9, the 7T SRAM cell 100 also includes the dielectric feature 110. The dielectric feature 110 may be formed in a continuous-poly-on-diffusion-edge (CPODE) process. In a CPODE process, at least a portion of a polysilicon gate and the channel region thereunder are replaced by a dielectric feature, and a remaining portion of the polysilicon gate may be replaced by a functional gate structure. For purposes of this disclosure, a "diffusion edge" may be equivalently referred to as an active edge, where for example an active edge abuts adjacent active regions. The dielectric feature 110 is also referred to as a CPODE feature 110. The CPODE feature 110 extends into the substrate 902.

Still referring to FIGS. 9-10, the memory device 1000 also includes a contact etch stop layer (CESL) 914 and a first interlayer dielectric (ILD) layer 916 deposited over the N-type source/drain features 910N and the P-type source/drain features 910P. The CESL 914 may include silicon nitride, silicon oxynitride, and/or other materials known in the art and may be formed by ALD, plasma-enhanced chemical vapor deposition (PECVD) process and/or other suitable deposition or oxidation processes. The first ILD layer 916 may be deposited by a PECVD process or other suitable deposition technique after the deposition of the CESL 914. The first ILD layer 916 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The memory device 1000 also includes an etch stop layer 918 and a second interlayer dielectric (ILD) layer 920 deposited over the first ILD layer 916 and the gate structures (including the gate structures 112, 114, 116, 118, 120). The formations and compositions of the etch stop layer 918 and the second ILD layer 920 are similar to those of the CESL 914 and the first ILD layer 916, respectively.

Still referring to FIGS. 9 and 10, the memory device 1000 includes the source/drain contacts (including the source/drain contacts 160E, 160H, 160F) extending through the etch stop layer 918, the first and second ILD layers 916 and 920, and the CESL 914. Each of the frontside source/drain contacts (including the source/drain contacts 160E, 160H,

160F) are formed over the respective source/drain features and electrically coupled to the respective source/drain feature via a silicide layer 922. The source/drain contacts (including the source/drain contacts 160E, 160H, 160F) may include any suitable conductive material, such as Cu, W, Ru, Co, Al, Ti, Ta, other suitable metals, or combinations thereof and may further include a barrier layer comprising any suitable material, such as Ti, Ta, TiN, TaN, other suitable materials, or combinations thereof. In some embodiments, the silicide layer 922 may include nickel silicide, titanium silicide, cobalt silicide, other suitable silicides, or combinations thereof.

With reference to FIG. 10, the memory device 1000 include an interconnect structure 924. The interconnect structure 924 includes the source/drain contact via 170H at the V0 level landing on the source/drain contact 160H. The interconnect structure 924 also includes the source/drain contact via 170G at the V0 level landing on the source/drain contact 160G. The interconnect structure 924 also includes the VSS line 510 at the M0 level disposed on the source/drain contact via 170G, the metal lines 520, 530B, 540A, and 550 at the M0 level disposed on dielectric layers (e.g., low-k dielectric material, silicon oxide, other suitable dielectric materials), and the VDD line 560 at the M0 level disposed on the source/drain contact via 170H.

To increase the design flexibility of metal lines at the M0 level and alleviate leakage and overlay issues, the read-port bit line R_BL of the memory device 1000 is disposed under the SRAM cell 100. As depicted in FIGS. 9-10, the memory device 1000 includes the backside contact via 610 disposed under the source/drain feature of the SRAM cell 100, more specifically, the backside contact via 610 is disposed under the source/drain feature 182 of the read-port pass-gate transistor R-PG of the SRAM cell 100. A silicide layer 926 is disposed between the backside contact via 610 and the source/drain feature 182 of the read-port pass-gate transistor R-PG. That is, the backside contact via 610 is electrically connected to the source/drain feature 182 of the read-port pass-gate transistor R-PG by way of the silicide layer 926. Composition the silicide layer 926 may be similar to that of the silicide layer 922.

The memory device 1000 includes the backside metal line 620, which is the read-port bit line R_BL, disposed under the source/drain feature 182 of the read-port pass-gate transistor R-PG of the SRAM cell 100. As depicted in FIG. 9, the backside metal line 620 is disposed under and in direct contact with the backside contact via 610. The memory device 1000 also includes a dielectric liner 928. In some embodiments, the dielectric liner 928 may include silicon nitride or other suitable materials. In embodiments represented in FIGS. 9-10, the dielectric liners 928 includes a first portion in direct contact with the backside contact via 610 and a second portion in direct contact with the backside metal line 620. That is, the backside contact via 610 and the backside metal line 620 are physically and electrically isolated from the substrate 902 by the dielectric liner 928. The backside metal line 620 is embedded in a dielectric layer 930 (shown in FIG. 10). The dielectric layer 930 may be similar to the first ILD layer 916. The backside metal line 620 has a thickness T1 along the Y-axis, and the metal lines (including the metal lines 510-550) at the M0 level each has a thickness T2 along the Y-axis. Since the backside metal line 620 is formed under the SRAM cell 100 instead of being formed over the SRAM cell 100, the dimensions of the backside metal line 620 may be flexibly adjusted to achieve satisfactory performance. That is, the parasitic capacitance and parasitic resistance of the memory device 1000 may be optimized by adjusting the dimensions (e.g., width, thickness) of the backside metal line 620. For example, the width W2 of the backside metal line 620 may be adjusted to provide a satisfactory parasitic capacitance. In some embodiments, the ratio of the width W2 to the width D2 may be in a range between about 0.3 and about 2. In an embodiment, a ratio of the thickness T1 to the thickness T2 (i.e., T1/T2) is in a range between about 1.5 and about 3. Due to this thickness relationship, the critical dimension of the metal lines (including the metal lines 510-550) at the M0 level may be decreased without substantially changing the total parasitic resistance of the memory device 1000 since the thicker backside metal line 620 provides a reduced parasitic resistance. That is, by forming the read-port bit line R_BL at the backside of the SRAM cell 100, the metal lines (including the metal lines 510-550) at the M0 level may be further scaled down for future cell shrinkage.

FIG. 11 illustrates an alternative layout of the memory device 1000 having the SRAM cell of FIG. 2, in portion or entirety, in accordance with some embodiments of the present disclosure. The layout of the memory device 1000 represented by FIG. 11 is similar to the that of FIG. 4, and one of the differences between includes that, the memory device 1000 represented by FIG. 11 does not include the dummy source/drain contacts 160A and 160B.

FIG. 12 illustrates a layout of various layers of a memory device 2000, in portion or entirety, according to various aspects of the present disclosure. As depicted in FIG. 12, the memory device 2000 includes two SRAM cells. For example, the memory device 2000 includes the SRAM cell 100A and the SRAM cell 100C. The layout of the SRAM cell 100A is substantially the same as the layout of the SRAM cell 100 described with reference to FIG. 4, and the layout of the SRAM cell 100C is a mirror image of a layout of the SRAM cell 100A with respect to the X-axis. The SRAM cell 100C includes pull-up transistors PU-1', PU-2', pull-down transistors PD-1', PD-2', pass-gate transistors PG-1', PG-2', and read-port pass-gate transistor R-PG' formed by gate structures 112', 114', 116', 118', 120' and N-type fin 102' and P-type fin 104'.

The memory device 2000 includes the backside contact via 610 and the backside metal line 620 formed under the SRAM cell 100A, as described above with reference to FIG. 6. Similarly, the memory device 2000 includes a backside contact via 610' and a backside metal line 620' formed under the SRAM cell 100C. The backside contact via 610' and the backside metal line 620' are similar to the backside contact via 610 and the backside metal line 620, respectively. That is, the backside contact via 610' is disposed directly under and electrically coupled to a source/drain feature of the read-port pass-gate transistor R-PG', and the backside metal line 620' is disposed directly under and in direct contact with the backside contact via 610'.

In embodiments represented by FIG. 12, each of the backside metal line 620 and 620' extends lengthwise along the X-axis and has a uniform width. When viewed from top, each of the backside metal line 620 and 620' has a rectangular shape. The backside metal line 620 is spaced apart from the backside metal line 620' by a distance S1. In some embodiments, a ratio of the distance S1 to the width D1 of the N-type fin 102 (i.e., S1/D1) is in a range between about 0.3 and about 3. Each of the backside metal line 620 and 620' also vertically overlaps with the CPODE feature 110/110', gate structures 114/114', 116/116', and 118/118', respectively. The layout of CO level, V0 level, M0 level, V1 level, M1 level, V2 level, and M2 level of the memory device 2000 include a first portion substantially same to that of the memory device 1000 and a second portion which is a mirror image of the first portion with respect to the X-axis, and repeated description is omitted for reason of simplicity.

FIGS. 13, 14, and 15 illustrate alternative layouts of various layers of the memory device 2000 in FIG. 12, in portion or entirety, according to various aspects of the present disclosure. The layouts of the memory device 2000 represented by FIG. 13, FIG. 14 and FIG. 15 are similar to the layout of the memory device 2000 represented by FIG. 12, but provides a reduced parasitic capacitance. For clarity and simplicity, similar features in the illustrated embodiments as shown in FIGS. 12-15 are identified by the same reference numerals, and such similar aspects are not repeated.

One difference between these layouts in FIG. 12 and FIGS. 13-15 is that shapes of top views of the backside metal lines 620 and 620' in FIGS. 13-15 are different from those in FIG. 12. More specifically, different from the backside metal line 620/620' in FIG. 12 that has a rectangular shape and a uniform width, the backside metal line 620/620' in FIGS. 13-15 has a non-uniform width. The backside metal line 620/620' in FIGS. 13-15 includes a main portion 1200a extending lengthwise along the X-axis and having a uniform width D3 and an edge portion 1200b protruding from the main portion 1200a along the Y-axis. That is, the backside metal line 620/620' in FIGS. 13-15 has a non-uniform width left to right. In an embodiment, a ratio of the width D3 to the width D1 of the N-type fin 102/102' is between about 0.3 and about 3.

The main portion 1200a of the backside metal line 620 is spaced apart from the main portion 1200a of the backside metal line 620' by a distance S2. In an embodiment, to significantly reduce the parasitic capacitance of the memory device, a ratio of the distance S2 to the distance S1 (shown in FIG. 12) is greater than 5. In the present embodiments represented by FIGS. 13-15, to further reduce the parasitic capacitance of the memory device 2000, the main portion 1200a of the backside metal line 620/620' is placed directly over the center of the SRAM cell 100A/100C. In other words, when viewed from top as represented by FIG. 13, a distance S3 between a central line (represented by a dashed line 620c) of the backside metal line 620/620' and the N-type fin 102/102' is substantially equal to a distance S4 between the central line of the backside metal line 620/620' and the P-type fin 104/104'.

The edge portion 1200b of the backside metal line 620/620' is formed under and in direct contact with the backside contact via 610/610'. In embodiments represented by FIGS. 13-15, the edge portion 1200b has a width D4 along the Y-axis, and a ratio of the width D4 to the width D2 is in a range between about 0.3 and about 3. As depicted in FIGS. 13-15, the edge portion 1200b of the backside metal line 620 is partially vertically overlapped with the P-type fin 106. In some embodiments, a ratio of a width D5 (shown in FIG. 14) of the part of edge portion 1200b formed directly under the P-type fin 106 to the width D2 is in a range between about 0.3 and about 1.

FIGS. 13-15 depict three different positional relationships between the edge portion 1200b and the backside contact via 610/610'. More specifically, in embodiments represented by FIG. 13, using the SRAM cell 100A as an example, when viewed from top, a bottom edge 1200c of the edge portion 1200b of the backside metal line 620 is aligned with a bottom edge 610e of the backside contact via 610. In embodiments represented by FIG. 14, the bottom edge 1200e of the edge portion 1200b of the backside metal line 620 is not aligned with a bottom edge 610e of the backside contact via 610, and the edge portion 1200b is partially vertically overlapped with the backside contact via 610 of the SRAM cell 100A. In embodiments represented by FIG. 15, the bottom edge 1200e of the edge portion 1200b of the backside metal line 620 is not aligned with a bottom edge 610e of the backside contact via 610, and the backside contact via 610 of the SRAM cell 100A is fully vertically overlapped with the edge portion 1200b of the backside metal line 620. That is, when viewed from top, the edge portion 1200b extends out of the backside contact via 610.

In the above embodiments described with reference to FIGS. 4-15, structures of memory devices including 7T SRAM cells are described. The inventive concepts (e.g., forming the read-port bit line R_BL at the backside of the SRAM cell) are also applicable for memory devices including a two-port SRAM cell that has eight transistors (8T). FIG. 16 is a circuit diagram of an 8T SRAM cell 100' that can be implemented in the IC chip of FIG. 1, according to various aspects of the present disclosure. The 8T SRAM cell 100' is similar to the 7T SRAM cell 100, and one difference between the two SRAM cells is that the 8T SRAM cell 100' includes another read-port pass gate transistor R-PG2. The read-port bit line RBL of a memory device including the 8T SRAM cell 100' may be formed under the 8T SRAM cell 100'.

Although not intended to be limiting, one or more embodiments of the present disclosure provide many benefits to a memory device and the formation thereof. It is understood, however, that other embodiments may offer additional advantages, and not all advantages are necessarily disclosed herein, and that no particular advantage is required for all embodiments. For example, the present disclosure provides a memory device including a SRAM cell and a read-port bit line disposed under the SRAM cell. Forming the read-port bit line disposed under the SRAM cell relaxes the design flexibility of frontside conductive features (e.g., metal lines) formed over the SRAM cell, alleviates leakage and short issue associated with the frontside conductive features, and offers scaling capability to accommodate fabrication of devices at advanced technology nodes. In some embodiments, forming the read-port bit line disposed under the SRAM cell allows reduction of the parasitic capacitance and parasitic resistance of the memory device, thereby improving the overall performance.

The present disclosure provides for many different embodiments. Semiconductor structures and methods of fabrication thereof are disclosed herein. In one exemplary aspect, the present disclosure is directed to a semiconductor structure. The semiconductor structure includes a two-port static random-access memory (SRAM) cell that includes a write port portion and a read port portion electrically coupled to the write port portion and comprising a transistor having a first source/drain feature and a second source/drain feature. The semiconductor structure also includes a first plurality of metal lines comprising a write bit line and a complementary write bit line, wherein the first plurality of metal lines are positioned at a first metal interconnect layer, wherein the first metal interconnect layer is disposed over the first source/drain feature; and a read bit line positioned at a second metal interconnect layer, wherein the second metal interconnect layer is disposed under the first source/drain feature.

In some embodiments, the semiconductor structure may also include a first silicide layer disposed under and in direct contact with the first source/drain feature of the transistor, a first via disposed under and in direct contact with the first silicide layer, wherein the second metal interconnect layer is disposed under and in direct contact with the first via. In some embodiments, the semiconductor structure may also include a first source/drain contact disposed directly over the first source/drain feature of the transistor. In some embodiments, the semiconductor structure may also include a second silicide layer disposed over and in direct contact with the second source/drain feature of the transistor, and a second source/drain contact disposed directly over and electrically coupled to the second source/drain feature of the transistor. In some embodiments, the transistor may include a vertical stack of nanostructures disposed between the first and second source/drain features, and a gate structure wrapping around each nanostructure of the vertical stack of nanostructures and extending lengthwise along a first direction. The second metal interconnect layer may extend lengthwise along a second direction substantially perpendicular to the first direction. In some embodiments, the semiconductor structure may also include a gate via electrically coupled to the gate structure, a read word line landing pad in a third metal interconnect layer and electrically coupled to the gate via, and a read word line in a fourth metal interconnect layer and electrically coupled to the read word line landing pad, and the fourth metal interconnect layer may be disposed between the third metal interconnect layer and the first metal interconnect layer. In some embodiments, a ratio of a thickness of the second metal interconnect layer to a thickness of the third metal interconnect layer may be in a range between 1.5 and 3. In some embodiments, the read bit line may include a main portion extending lengthwise along a first direction and an end portion extending lengthwise along a second direction substantially perpendicular to the first direction, the end portion may be at least partially vertically overlapped with the first source/drain feature of the transistor. In some embodiments, the read bit line may include a uniform width, and in a top view, a shape of the read bit line may include a rectangle shape.

In another exemplary aspect, the present disclosure is directed to a semiconductor structure. The semiconductor structure includes a memory cell connected to a read bit line and a write bit line, a first interconnect structure disposed over the memory cell and comprising the write bit line, and a second interconnect structure disposed under the memory cell and comprising the read bit line.

In some embodiments, the memory cell may include a first active region and a second active region extending lengthwise along a first direction, and first and second gate structures extending lengthwise in a second direction perpendicular to the first direction. The first gate structure engages the first active region in forming an N-type transistor, and a source/drain feature of the N-type transistor is electrically coupled to the write bit line, and the second gate structure engages the second active region in forming a P-type transistor, wherein an edge of the second gate structure is aligned with an edge of the first gate structure along the second direction, and a source/drain feature of the P-type transistor is electrically coupled to the read bit line. In some embodiments, the second interconnect structure may include a contact via disposed directly under the source/drain feature of the P-type transistor, and a metal interconnect layer disposed under and in direct contact with the contact via. The read bit line may be positioned at the metal interconnect layer. In some embodiments, the read bit line may include a main portion extending lengthwise along the first direction and an end portion protruding from the main portion along the second direction, and the end portion may be in direct contact with the contact via. In some embodiments, in a top view, a distance between the main portion and the first active region may be substantially equal to a distance between the main portion and the second active region. In some embodiments, in a top view, the read bit line may fully extend through the memory cell. In some embodiments, the read bit line may have a uniform width.

In yet another exemplary aspect, the present disclosure is directed to a semiconductor structure. The semiconductor structure includes a memory cell comprising a write port portion and a read port portion comprising a transistor having a first source/drain feature and a second source/drain feature, wherein the first source/drain feature is electrically connected to the write port portion. The semiconductor structure also includes a contact via disposed directly under and electrically coupled to the second source/drain feature, and a first metal interconnect layer disposed under and in direct contact with the contact via, wherein a read bit line is positioned at the first metal interconnect layer.

In some embodiments, the memory cell is connected to a first power line for receiving a first power supply voltage, and a second power line for receiving a second power supply voltage, the first power line and the second power line may be positioned at a second metal interconnect layer disposed over the first source/drain feature.

In some embodiments, the memory cell may include a seven-transistor static random access memory (SRAM) cell. In some embodiments, the memory cell may include an eight-transistor static random access memory (SRAM) cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a two-port static random access memory (SRAM) cell comprising:
   a write port portion; and
   a read port portion electrically coupled to the write port portion and comprising a transistor having a first source/drain feature and a second source/drain feature;
   a first plurality of metal lines comprising a write bit line and a complementary write bit line, wherein the first plurality of metal lines are positioned at a first metal interconnect layer, wherein the first metal interconnect layer is disposed over the first source/drain feature; and
   a read bit line positioned at a second metal interconnect layer, wherein the second metal interconnect layer is disposed under the first source/drain feature.

2. The semiconductor structure of claim 1, further comprising:
   a first silicide layer disposed under and in direct contact with the first source/drain feature of the transistor; and
   a first via disposed under and in direct contact with the first silicide layer,
   wherein the second metal interconnect layer is disposed under and in direct contact with the first via.

3. The semiconductor structure of claim 2, further comprising:

a first source/drain contact disposed directly over the first source/drain feature of the transistor.

4. The semiconductor structure of claim 2, further comprising:

a second silicide layer disposed over and in direct contact with the second source/drain feature of the transistor; and a second source/drain contact disposed directly over and electrically coupled to the second source/drain feature of the transistor.

5. The semiconductor structure of claim 1, wherein the transistor further comprises:

a vertical stack of nanostructures disposed between the first and second source/drain features; and a gate structure wrapping around each nanostructure of the vertical stack of nanostructures and extending lengthwise along a first direction, wherein the second metal interconnect layer extends lengthwise along a second direction substantially perpendicular to the first direction.

6. The semiconductor structure of claim 5, further comprising:

a gate via electrically coupled to the gate structure;

a read word line landing pad in a third metal interconnect layer and electrically coupled to the gate via; and a read word line in a fourth metal interconnect layer and electrically coupled to the read word line landing pad, wherein the fourth metal interconnect layer is disposed between the third metal interconnect layer and the first metal interconnect layer.

7. The semiconductor structure of claim 6, wherein a ratio of a thickness of the second metal interconnect layer to a thickness of the third metal interconnect layer is in a range between 1.5 and 3.

8. The semiconductor structure of claim 1, wherein, the read bit line comprises a main portion extending lengthwise along a first direction and an end portion extending lengthwise along a second direction substantially perpendicular to the first direction, wherein the end portion is at least partially vertically overlapped with the first source/drain feature of the transistor.

9. The semiconductor structure of claim 1, wherein the read bit line comprises a uniform width, and in a top view, a shape of the read bit line comprises a rectangle shape.

10. A semiconductor structure, comprising:

a memory cell connected to a read bit line and a write bit line;

a first interconnect structure disposed over the memory cell and comprising the write bit line; and a second interconnect structure disposed under the memory cell and comprising the read bit line.

11. The semiconductor structure of claim 10, wherein the memory cell comprises:

a first active region and a second active region extending lengthwise along a first direction; and first and second gate structures extending lengthwise in a second direction perpendicular to the first direction, wherein the first gate structure engages the first active region in forming an N-type transistor, and a source/drain feature of the N-type transistor is electrically coupled to the write bit line, and wherein the second gate structure engages the second active region in forming a P-type transistor, wherein an edge of the second gate structure is aligned with an edge of the first gate structure along the second direction, and a source/drain feature of the P-type transistor is electrically coupled to the read bit line.

12. The semiconductor structure of claim 11, wherein the second interconnect structure comprises a contact via disposed directly under the source/drain feature of the P-type transistor, and a metal interconnect layer disposed under and in direct contact with the contact via, wherein the read bit line is positioned at the metal interconnect layer.

13. The semiconductor structure of claim 12, wherein the read bit line comprises a main portion extending lengthwise along the first direction and an end portion protruding from the main portion along the second direction, and the end portion is in direct contact with the contact via.

14. The semiconductor structure of claim 13, wherein, in a top view, a distance between the main portion and the first active region is substantially equal to a distance between the main portion and the second active region.

15. The semiconductor structure of claim 12, wherein, in a top view, the read bit line fully extends through the memory cell.

16. The semiconductor structure of claim 12, wherein the read bit line comprises a uniform width.

17. A semiconductor structure, comprising:

a memory cell comprising:

a write port portion; and a read port portion comprising a transistor having a first source/drain feature and a second source/drain feature, wherein the first source/drain feature is electrically connected to the write port portion, a contact via disposed directly under and electrically coupled to the second source/drain feature; and a first metal interconnect layer disposed under and in direct contact with the contact via, wherein a read bit line is positioned at the first metal interconnect layer.

18. The semiconductor structure of claim 17, wherein the memory cell is connected to a first power line for receiving a first power supply voltage and a second power line for receiving a second power supply voltage, wherein the first power line and the second power line are positioned at a second metal interconnect layer disposed over the first source/drain feature.

19. The semiconductor structure of claim 17, wherein the memory cell comprises a seven-transistor static random access memory (SRAM) cell.

20. The semiconductor structure of claim 17, wherein the memory cell comprises an eight-transistor static random access memory (SRAM) cell.

* * * * *